(12) United States Patent
Okita

(10) Patent No.: US 6,378,104 B1
(45) Date of Patent: Apr. 23, 2002

(54) REED-SOLOMON CODING DEVICE AND METHOD THEREOF

(75) Inventor: Shigeru Okita, Tokyo-To (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/960,812

(22) Filed: Oct. 30, 1997

(30) Foreign Application Priority Data

Oct. 30, 1996 (JP) ............................................ 8-288275

(51) Int. Cl.$^7$ ............................................ H03M 13/15
(52) U.S. Cl. ...................... 714/784; 714/774
(58) Field of Search ................. 714/784, 774

(56) References Cited

U.S. PATENT DOCUMENTS

| | | | | |
|---|---|---|---|---|
| 4,649,541 A | * | 3/1987 | Lahmeyer | 371/37 |
| 4,873,688 A | * | 10/1989 | Maki et al. | 371/37.1 |
| 5,130,990 A | * | 7/1992 | Hsu et al. | 371/37.1 |
| 5,323,402 A | * | 6/1994 | Vaccaro et al. | 371/37.1 |
| 5,377,207 A | * | 12/1994 | Perlman | 371/37.1 |
| 5,768,296 A | * | 6/1998 | Langer et al. | 371/37.11 |
| 5,778,009 A | * | 7/1998 | Fredrickson et al. | 371/37.1 |

OTHER PUBLICATIONS

Hasan, "An Architecture for a Universal Reed–Solomon Encoder Using A Triangular Basis Multiplication Algorithm", Canadian Conf. on Electrical and Computer Engineering, 1993, pp. 255–258.*

Hasan et al. "Architecture for a Low Complexity Rate–Adaptive Reed–Solomon Encoder", IEEE Trans. on Computers, vol. 44, No. 7, Jul. 1993, pp. 983–942.*

* cited by examiner

Primary Examiner—Stephen M. Baker
(74) Attorney, Agent, or Firm—Bret J. Peterson; Frederick J. Telecky, Jr.

(57) ABSTRACT

To provide a type of Reed-Solomon coding device that allows a reduction of the size and price of the device. When the coding of the Galois field $GF_b(2^m)$ is performed, in the input-side transformation circuit 116b, the Galois field of the input data is transformed from $GF_b(2^m)$ into $GF_a(2^m)$. In RS coding/decoding core unit 112, an operation is then performed on Galois field $GF_a(2^m)$ to generate the coding data. In output-side transformation circuit 119b, the coding data are transformed from $GF_a(2^m)$ into $GF_b(^2m)$. In RS coding/decoding core unit 112, a multiplier corresponding to Galois field $GF_a(2^m)$ is set.

13 Claims, 10 Drawing Sheets

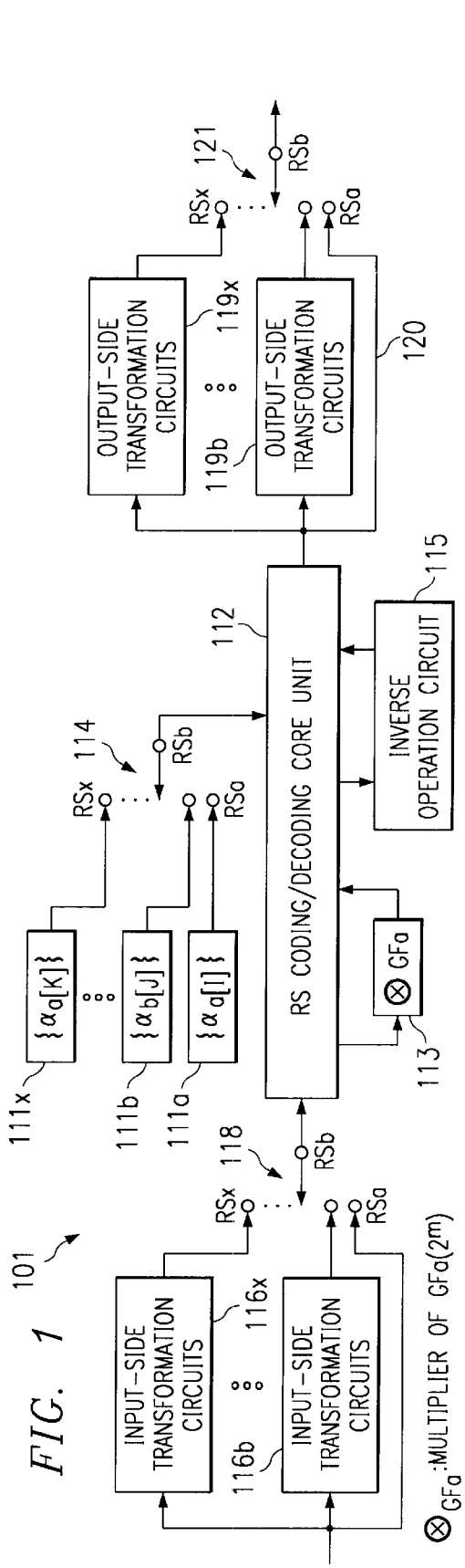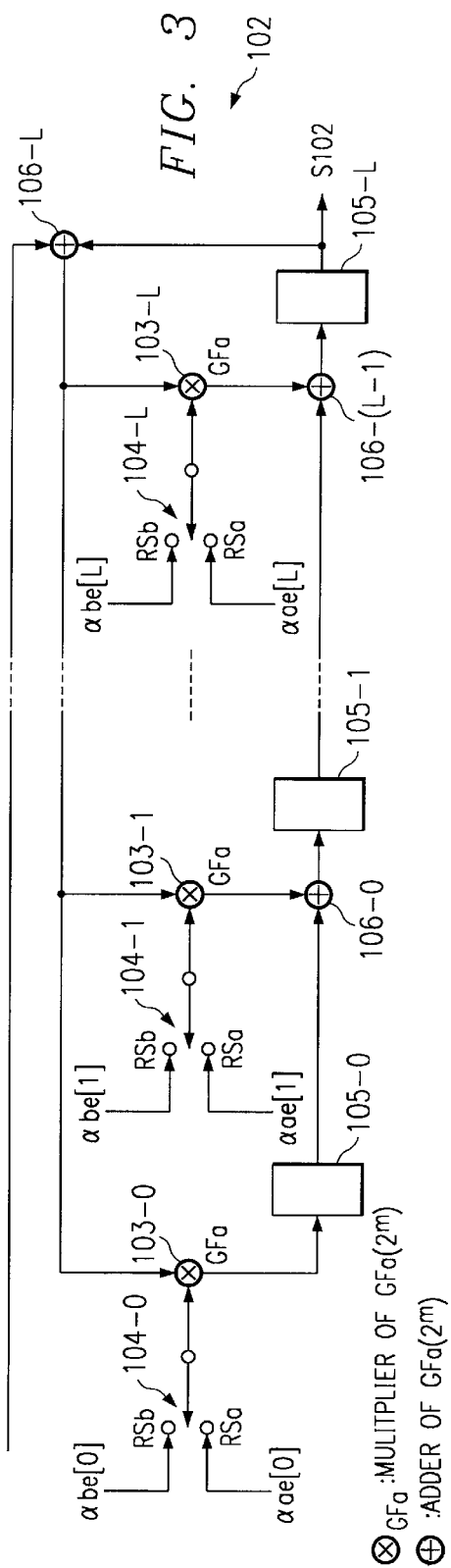

FIG. 2

| $\beta^z$ | COLUMN VECTOR | $\alpha^{pz}$ | COLUMN VECTOR |
|---|---|---|---|
| 0 | $(0\ 0\ 0\ 0\ 0\ 0\ 0\ 0)^T$ | 0 | $(0\ 0\ 0\ 0\ 0\ 0\ 0\ 0)^T$ |
| $\beta^0$ | $(0\ 0\ 0\ 0\ 0\ 0\ 0\ 1)^T$ | $\alpha p \times 0 = \alpha^0$ | $(0\ 0\ 0\ 0\ 0\ 0\ 0\ 1)^T$ |
| $\beta^1$ | $(0\ 0\ 0\ 0\ 0\ 0\ 1\ 0)^T$ | $\alpha p \times 1 = \alpha^{241}$ | $(0\ 1\ 0\ 1\ 1\ 0\ 0\ 0)^T$ |
| $\beta^2$ | $(0\ 0\ 0\ 0\ 0\ 1\ 0\ 0)^T$ | $\alpha p \times 2 = \alpha^{227}$ | $(1\ 0\ 0\ 1\ 0\ 0\ 0\ 0)^T$ |
| $\beta^3$ | $(0\ 0\ 0\ 0\ 1\ 0\ 0\ 0)^T$ | $\alpha p \times 3 = \alpha^{213}$ | $(1\ 1\ 1\ 1\ 0\ 0\ 1\ 0)^T$ |
| $\beta^4$ | $(0\ 0\ 0\ 1\ 0\ 0\ 0\ 0)^T$ | $\alpha p \times 4 = \alpha^{199}$ | $(0\ 0\ 0\ 0\ 1\ 1\ 1\ 0)^T$ |
| $\beta^5$ | $(0\ 0\ 1\ 0\ 0\ 0\ 0\ 0)^T$ | $\alpha p \times 5 = \alpha^{185}$ | $(0\ 0\ 1\ 1\ 0\ 1\ 1\ 1)^T$ |
| $\beta^6$ | $(0\ 1\ 0\ 0\ 0\ 0\ 0\ 0)^T$ | $\alpha p \times 6 = \alpha^{171}$ | $(1\ 0\ 1\ 1\ 0\ 0\ 1\ 1)^T$ |
| $\beta^7$ | $(1\ 0\ 0\ 0\ 0\ 0\ 0\ 0)^T$ | $\alpha p \times 7 = \alpha^{157}$ | $(1\ 1\ 0\ 1\ 0\ 1\ 0\ 1)^T$ |
| $\beta^8$ | $(0\ 0\ 1\ 0\ 1\ 1\ 0\ 1)^T$ | $\alpha p \times 8 = \alpha^{143}$ | $(0\ 1\ 0\ 1\ 0\ 1\ 0\ 0)^T$ |
| $\beta^9$ | $(0\ 1\ 0\ 1\ 1\ 0\ 1\ 0)^T$ | $\alpha p \times 9 = \alpha^{129}$ | $(0\ 0\ 0\ 1\ 0\ 1\ 1\ 1)^T$ |
| ... | ... | ... | ... |
| $\beta^{91}$ | $(0\ 0\ 1\ 1\ 1\ 1\ 1\ 1)^T$ | $\alpha p \times 91 = \alpha^1$ | $(0\ 0\ 0\ 0\ 0\ 0\ 1\ 0)^T$ |
| ... | ... | ... | ... |
| $\beta^{254}$ | $(1\ 0\ 0\ 1\ 0\ 1\ 1\ 0)^T$ | $\alpha p \times 254 = \alpha^{14}$ | $(0\ 0\ 0\ 1\ 0\ 0\ 1\ 1)^T$ |

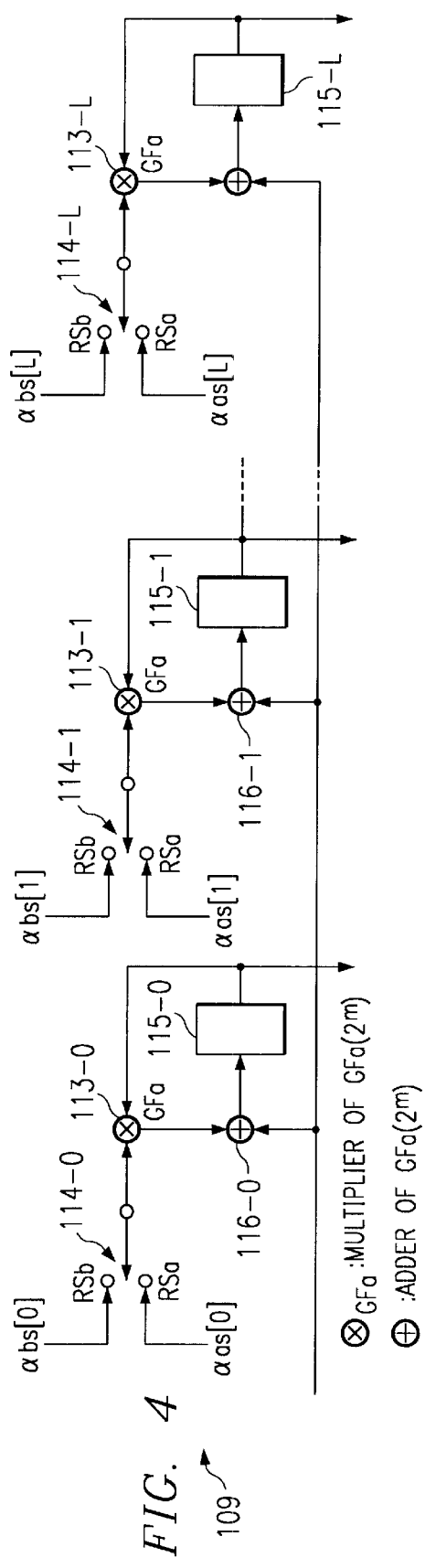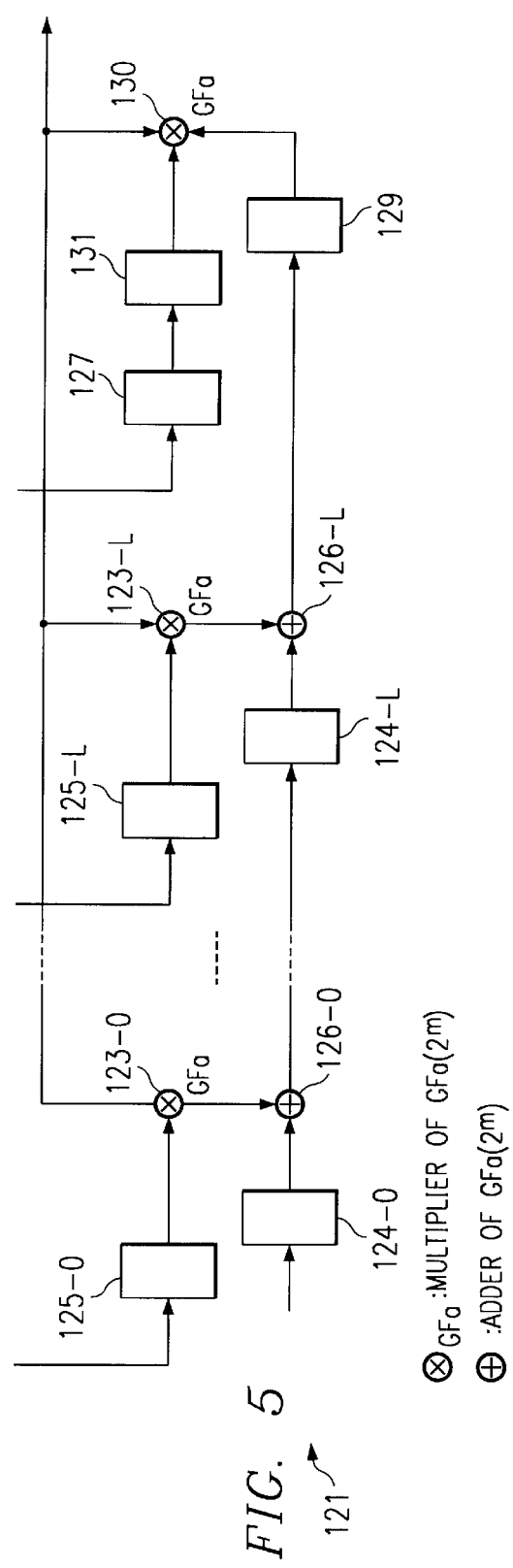
FIG. 4
FIG. 5

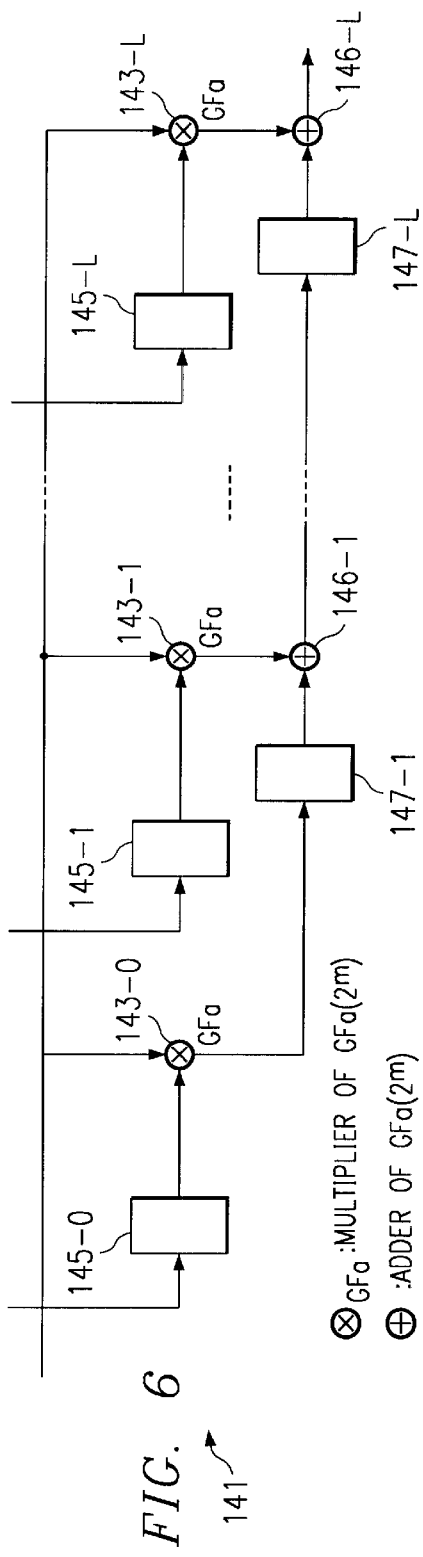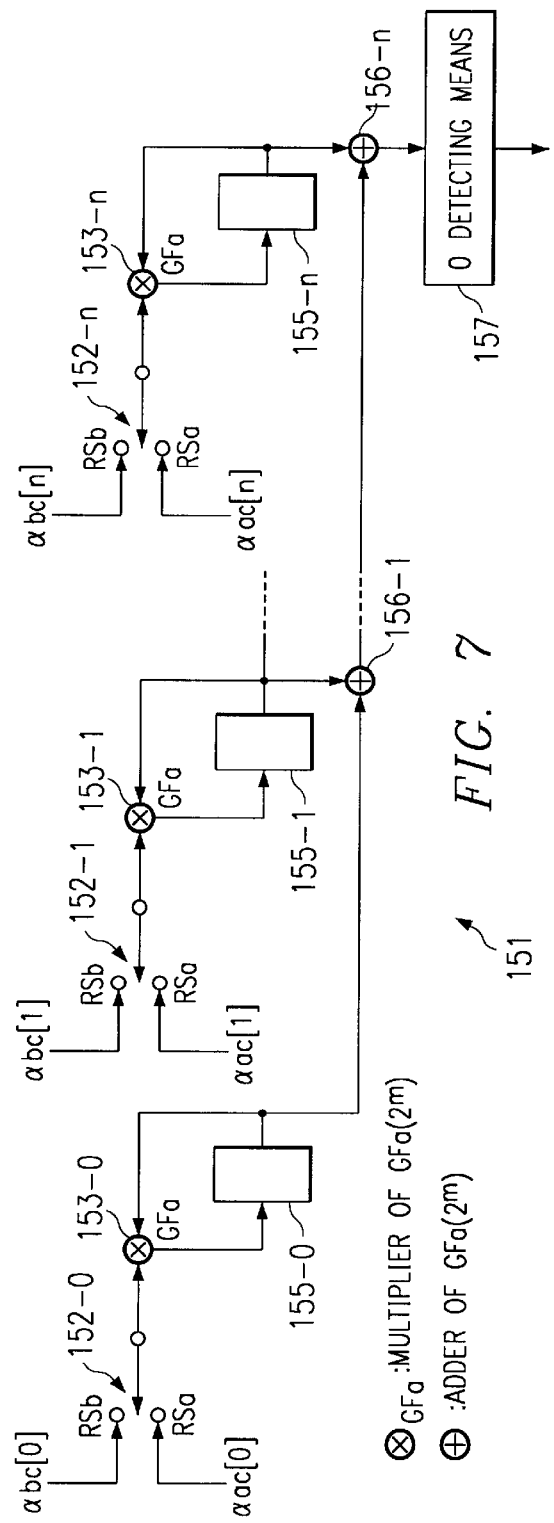

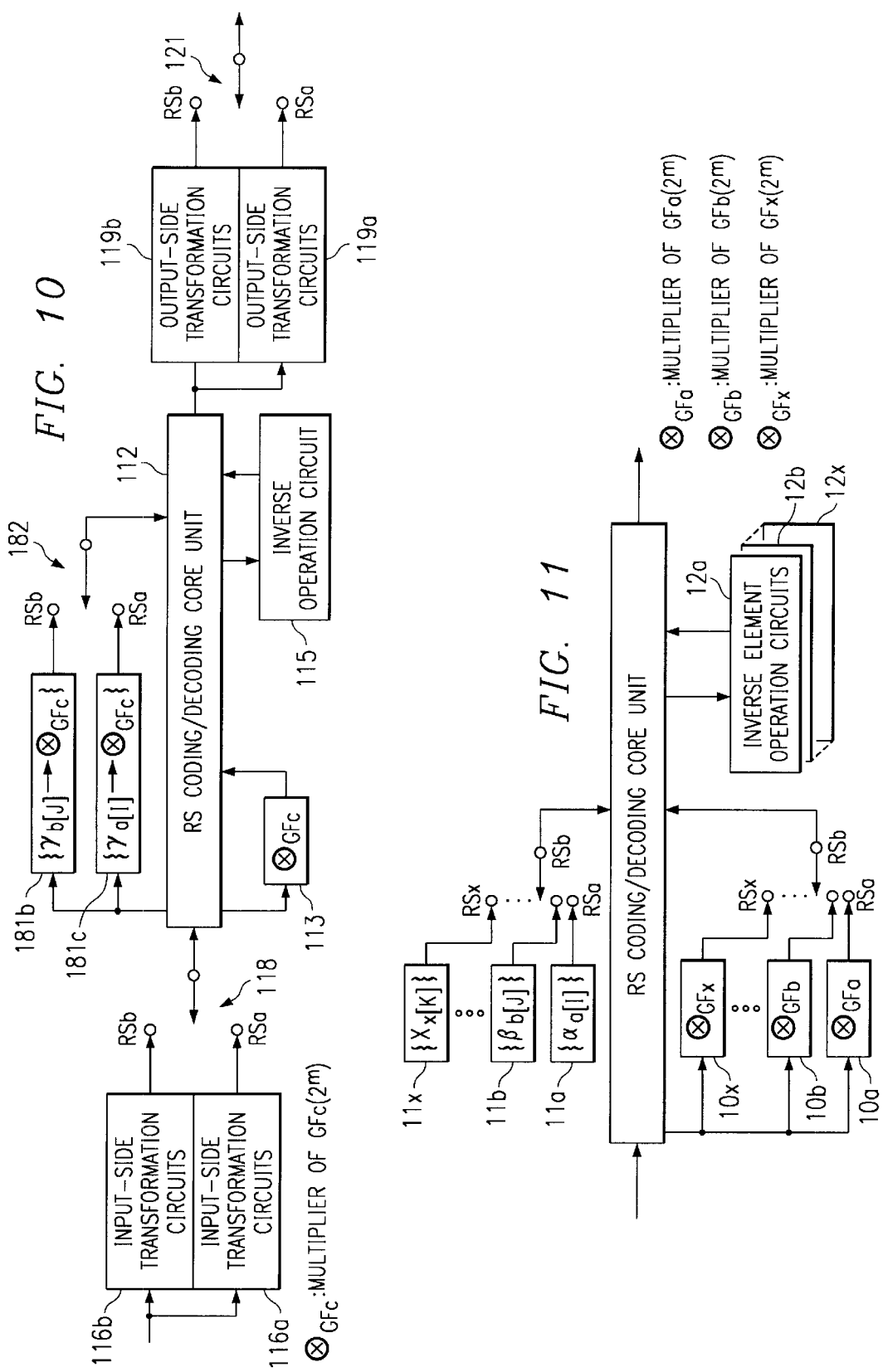

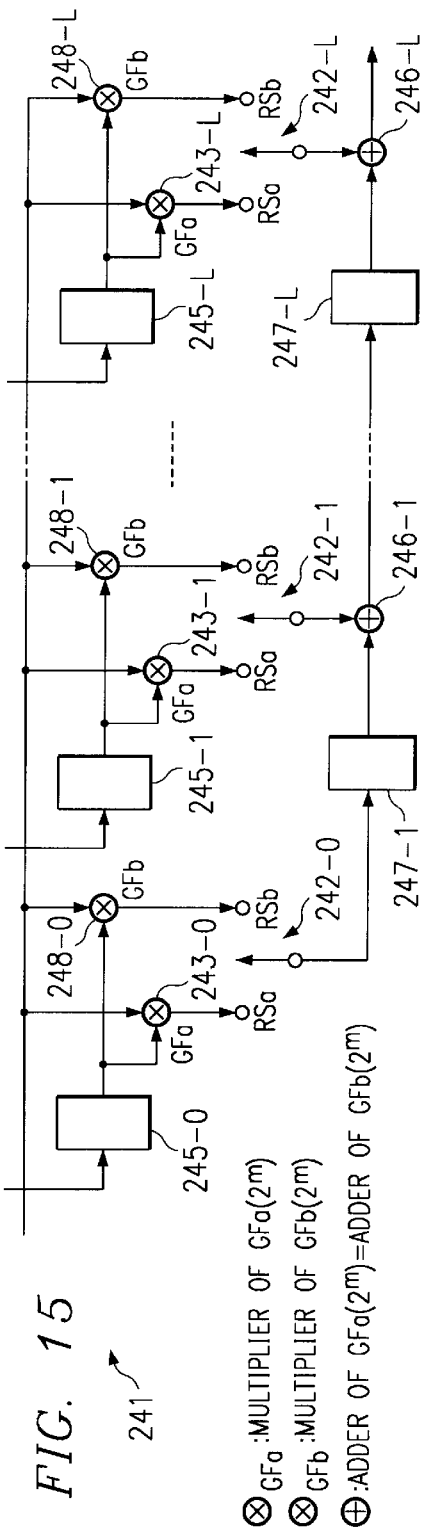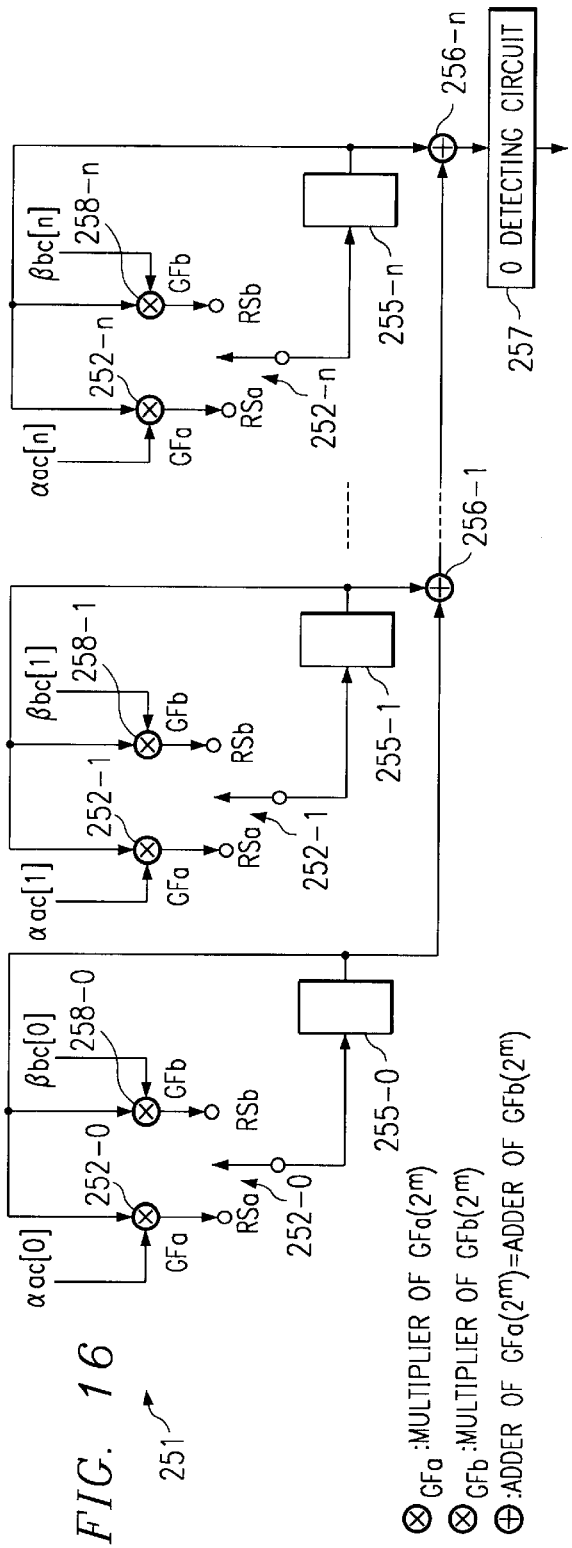

REED-SOLOMON CODING DEVICE AND METHOD THEREOF

FIELD OF THE INVENTION

This invention pertains to a Reed-Solomon coding and decoding device, as well as a method for use as the error correction code of recording media and digital transmission.

BACKGROUND OF THE INVENTION

The Reed-Solomon code (referred to as RS code hereinafter) has a high coding efficiency and good performance against burst error. Consequently, it is mainly used as the outer code of recording media and in digital transmission. Also, with the progress in IC technology, it becomes possible to realize coding/decoding IC on a single chip for handling codes with a relatively high correction power for 8-byte correction or higher, and the application range expands rapidly.

The RS code is characterized by the fact that the freedom is very high with respect to the construction method of coding. For example, for the Galois field $GF(2^8)$ used frequently in the RS code, usually, the period may be $2^8-1$ as a condition of the field generation polynomial, and hence various types exist. In addition, there is a very wide range of selection of the root of the code generation polynomial that realizes the same correction power. That is, supposing that the root of the field generation polynomial is $\alpha$, for the condition for realizing correction of the t-byte, as the root of the code generation polynomial, a group of at least 2t consecutive powers of $\alpha$, that is, $\{\alpha^b, \alpha^{b+1}, \alpha^{b+2}, \ldots, \alpha^{b+2t-1}\}$ is selected. Here, it is possible to select any integer as the value of b. Consequently, there is a significant number of RS codes that are different from each other and that have the same t-byte correction.

From the viewpoint of system development, such a level of freedom is preferred. From the viewpoint of standardization, this level is not sufficient. From the demand on the correction power, etc., usually, a Galois field $GF(2^8)$ having $2^8$ elements is usually adopted, while the other parameters may take different values. It is natural that the code length and correction power depend on the specifications demanded. Among the cited differences, that having the most significant influence is the difference of the field generation polynomial. For example, when RS coding/decoding devices corresponding to two schemes are formed, because their field generation polynomials are different from each other, their multipliers of the Galois field are also different from each other. Consequently, there is no way to share them. In particular, in order to meet a higher correction power, the proportion of the aforementioned multiplier of the Galois field in the circuit scale is large. In the conventional method, the multipliers of the Galois field corresponding to the two schemes have to be respectively equipped, so that the price of the device is boosted, which is a disadvantage.

As a matter of fact, even in the same field of digital transmission, the field generation polynomial adopted for satellite communications and the field generation polynomial adopted for satellite broadcasts are different. This is mainly due to the difficulty in standardization due to the difference in management between field of communications and the broadcast field. Also, at the time of standardization, there was a low necessity to share the field generation polynomial.

In recent years, studies have made it more and more clear that it is necessary to unify communications and broadcasts. However, once the standardization is completed, it becomes very difficult to change it. Also, the RS code adopted for the recording media is usually developed by the producers, yet in few cases, the same field generation polynomial is adopted by different recording media developed by different producers.

FIG. 11 is a schematic diagram illustrating the conventional RS coding/decoding device that can handle two or more RS codes, that is, $RS_a$ code, $RS_b$ code, $RS_x$ code. It is equipped with multipliers 10a–10x of Galois fields $GF_a(2^m)$, $GF_b(2^m)$, ... $GF_x(2^m)$ corresponding to the various field generation polynomials, respectively, as well as multiplication coefficient memory units 11a–11x that store sets of Galois field multiplication coefficient $\{\alpha_{a[I]}\}$, $\{\beta_{b[J]}\}$, ..., $\chi_{x\{[K]}\}$ respectively. The conventional RS coding/decoding device also has inverse element operation circuits 12a–12x for division operations corresponding to the various codes.

In the following description, in order to simplify the description, conventional RS coding/decoding device 1 for handling two RS codes, that is, the $RS_a$ code and $RS_b$ code, will be described. In this case, for both the $RS_a$ code and $RS_b$ code, the correction power is taken as a t-byte correction.

FIG. 12 is a diagram illustrating the polynomial remainder operation circuit 202 that forms conventional RS coding/decoding device 1. In remainder operation circuit 202, the set of Galois field multiplication coefficient $\{\alpha_{ae[i]}\}$, i=0–L is contained in the aforementioned Galois field's multiplication coefficient set $\{\alpha_{a[I]}\}$, and the Galois field's multiplication coefficient set $\{\beta_{be[j]}\}$, j=0–L is contained in the aforementioned set of Galois field multiplication coefficient $\{\beta_{b[J]}\}$. L is 2t−1 or 2t (same in the following).

As shown in FIG. 12, the polynomial operation circuit 202 has multipliers 203-0 to 203-L, multipliers 208-0 to 208-L, switches 204-0 to 204-L, registers 205-0 to 205-L, adders 206-0 to 206-L, and adder 207.

Switches 204-0-204-L select multipliers 203-0 to 203-L in the case of $RS_a$ coding, and they select multipliers 208-0 to 208-L in the case of $RS_b$ coding.

The RS decoding device usually comprises a syndrome operation circuit, error-position polynomial and evaluating polynomial operation circuit, error-position detector, evaluation value detector, and correction execution circuit. Among these, for the aforementioned error-position polynomial operation circuit and evaluating polynomial operation circuit, the Euclid and the Berlekamp-Massey algorithm are known algorithms.

FIG. 13 is a conventional structural example of syndrome operation circuit 209 that can handle the aforementioned two RS codes. In this case, the set of Galois field multiplication coefficient $\{\alpha_{as[I]}\}$, I=0~L is contained in said $\{\alpha_{a[I]}\}$, and the Galois field's multiplication coefficient assembly $\{\beta_{bs[J]}\}$, j=0~L is contained in said $\{\beta_{b[J]}\}$.

As shown in FIG. 13, syndrome operation circuit 209 has multipliers 213-0 to 213-L, switches 214-0 to 214-L, registers 215-0 to 214-L, adders 216-0 to 216-L, and multipliers 217-0 to 217-L.

Switches 214-0 to 214-L select multipliers 213-0 to 213-L in the case of $RS_a$ coding, and they select multipliers 217-0 to 217-L in the case of $RS_b$ coding.

FIG. 14 is a diagram illustrating a conventional structural example of polynomial divider 221, one of the principal structural elements of the operation circuit of the error-position polynomial and evaluation polynomial that can handle the aforementioned two RS codes.

As shown in FIG. 14, polynomial divider 221 has switches 222-0 to 222-L, multipliers 223-0 to 223-L, multipliers 228-0 to 228-L, registers 225-0 to 225-L, registers 224-0 to 224-L, adders 226-0-226-L, registers 227, 229, inverse element operation circuits 231, 232, multipliers 230, 231, and switch 234.

Switches 222-0 to 222-L select multipliers 223-0 to 223-L in the case of $RS_a$ coding, and they select multipliers 228-0 to 228-L in the case of $RS_b$ coding. Also, switch 234 selects multiplier 230 in the case of $RS_a$ coding, and selects multiplier 231 in the case of $RS_b$ coding.

FIG. 15 is a diagram illustrating a conventional structural example of polynomial multiplier 241, one of the principal structural elements of the operation circuit of the error-position polynomial and evaluation polynomial that can handle the aforementioned two RS codes.

As shown in FIG. 15, polynomial multiplier 241 has multipliers 243-0 to 243-L, multipliers 248-0 to 248-L, switches 242-0 to 242-L, registers 245-0 to 245-L, adders 246-0 to 246-L, and registers 247-0 to 247-L.

Switches 242-0 to 242-L select multipliers 243-0 to 243-L in the case of $RS_a$ coding, and they select multipliers 248-0 to 248-L in the case of $RS_b$ coding.

FIG. 16 is a diagram illustrating a structural example of conventional error-position detecting circuit 251 that can handle the aforementioned two RS codes.

As shown in FIG. 16, error-position detecting circuit 251 has multiplier 252-0 to 252-n, multipliers 258-0 to 258-n, switches 252-0 to 252-n, registers 255-0 to 255-n, adders 256-1 to 256-0, hand detecting circuit 257.

Switches 252-0 to 252-n select multipliers 252-0 to 252-n in the case of $RS_a$ coding, and they select multipliers 258-0 to 258-n in the case of $RS_b$ coding.

In this case, a set of Galois field multiplication coefficient $\{\alpha_{ac[I]}\}$, I=0~n=t is contained in said $\{\alpha_{a[I]}\}$, and a set of Galois field multiplication coefficient $\{\beta_{bc[j]}\}$, j=0~n=t is contained in said $\{\beta_{b[J]}\}$. When the erasure correction is carried out, one has I=0~n=2t, j=0~n=2t.

FIG. 17 is a diagram illustrating a conventional structural example of evaluation value detecting circuit 261 that can handle said two RS codes.

As shown in FIG. 17, evaluation value detecting circuit 261 has multipliers 262-0 to 262-(n−1), multipliers 267-0 to 267-(n−1), switches 262-0 to 262-(n−1), registers 265-0 to 265-(n−1), and adders 266-1 to 266-(n−1).

Switches 262-0 to 262-(n−1) select multipliers 262-0 to 262-(n−1) in the case of RS, coding, and they select multipliers 267-0 to 267-(n−1) in the case of $RS_b$ coding.

In this case, a set of Galois field multiplication coefficient $\{\alpha_{av[I]}\}$, I=0~n−1 is contained in said $\{\alpha_{a[I]}\}$, and a set of Galois field multiplication coefficient $\{\beta_{bv[j]}\}$, j=0~n−1 is contained in said $\{\beta_{b[J]}\}$.

In this way, the conventional RS coding/decoding device that can handle two or more RS codes is formed by necessarily having the Galois field multipliers and inverse element operation circuits corresponding to the respective field generation polynomials and for use in switching.

The purpose of this invention is to solve the aforementioned problems of the prior art by providing a type of Reed-Solomon coding method and a device with a reduced size and lower cost.

Another purpose of this invention is to provide a Reed-Solomon decoding method and device with a reduced size and lower cost.

SUMMARY OF THE INVENTION

In order to solve the aforementioned problems of the prior art, the Reed-Solomon coding device of this invention is one that can handle multiple RS (Reed-Solomon) codes using different field generation polynomials, and it has the following means: a Galois field transformation means that transforms the input data into the data of the prescribed Galois field; a coding means that performs coding processing of the aforementioned transformed data by means of the aforementioned Galois field after transformation; and a Galois field inverse transformation means that undertakes inverse transformation of the aforementioned Galois field of coded data to the Galois field before transformation.

In the Reed-Solomon coding device of this invention, by setting the Galois field transformation means and Galois field inverse transformation means, it is possible to perform the coding processing by means of the prescribed Galois field in the coding means for any of multiple RS codes. As a result, there is no need to set individual multipliers and inverse element operation units corresponding to all of the multiple RS codes, respectively, and the size of the circuit can be significantly reduced.

Also, in the Reed-Solomon coding device of this invention, the aforementioned coding means preferably has a multiplier corresponding to the aforementioned Galois field after transformation.

Also, in the Reed-Solomon coding device of this invention, preferably the aforementioned multiple RS codes are the $RS_a$ code and $RS_b$ code using different field generation polynomials; the coding symbols are Galois fields $GF_a(2^m)$ and $GF_b(2^m)$ extended based on m-th order field generation polynomials $Gp_a(x)$ and $Gp_b(X)$ which are different from each other, on Galois field GF(2), respectively; for $\alpha$ as the root of said $Gp_a(x)$ and as the primitive element of said $GF_a(2^m)$, and for $\beta$ as the root of said $Gp_b(x)$ and as the primitive element of said $GF_b(2^m)$, the following equation (25) is established; said $RS_b$ code has power of t-symbol correction, and its code generation polynomial $G_{cb}(x)$ is represented by the following equation (26); when the aforementioned input data are coded by said $RS_b$ code, said Galois field transformation means transforms the Galois field of the aforementioned input data from said Galois field $GF_b(2^m)$ into said Galois field $GF_a(2^m)$; the aforementioned coding means performs coding corresponding to the following equation (27) as a polynomial that transforms said code forming polynomial $G_{cb}(x)$ into said Galois field $GF_a(2^m)$; the aforementioned Galois field inverse transformation means undertakes inverse transformation of the aforementioned Galois field of coded data from said Galois field $GF_a(2^m)$ into said Galois field $GF_b(2^m)$.

$$Gp_b(\alpha^p)=0 \qquad \text{Equation 25}$$

Equation 26

$$Gc_b(x) = \prod_{j=0}^{L} (x + \beta^{q(b+j)}), \; L = 2t-1, \text{ or } 2t \qquad (26)$$

Equation 27

$$Gc_{ba}(x) = \prod_{j=0}^{L} (x + \alpha^{pq(b+j)}), \; L = 2t-1, \text{ or } 2t \qquad (27)$$

Also, in the Reed-Solomon coding device of this invention, preferably, with the transposed matrix represented as $(\ldots)^T$, when m values among the $2^m$ input/output relationships are as follows: with respect to m-bit input $(00 \ldots 0001)^T$, m-bit output $A_0=(00 \ldots 001)^T$ is performed; with respect to m-bit input $(00 \ldots 0010)^T$, m-bit output $A_1=(A_{1,m-1}, A_{1,m-2}, \ldots A_{1,0})^T$ is performed; with respect to m-bit $(00 \ldots 0100)^T$ m-bit output $A_2=(A_{2,m-1}, A_{2,m-2}, \ldots A_{2,0})^T$ is performed, with respect to m-bit input $(01 \ldots 0000)^T$, m-bit output $A_{m-2}=(A_{m-2,m-1}, A_{m-2,m-2}, \ldots A_{m-2,0})^T$ is performed; and with respect to m-bit input $(10 \ldots 0000)^T$, m-bit output $A_{m-1}=(A_{m-1,m-1}, A_{m-1,m-2}, \ldots A_{m-1,0})^T$ is performed; with m by m matrix $[H_{ba}]$ being defined by the following equation (28), the aforementioned Galois field transformation means performs operation processing corresponding to the following equation (29) with respect to said m-bit input data $D_{b\text{-}in}$ to generate m-bit output data $D_{a\text{-}out}$.

$$[H_{ba}]=(A_{m-1}A_{m-2} \ldots A_2A_1A_0) \quad \text{Equation 28}$$

$$D_{a\_out}=[H_{ba}]\times D_{b\_in} \quad \text{Equation 29}$$

Also, for the Reed-Solomon coding device of this invention, preferably, the aforementioned Galois field inverse transformation means performs operation processing corresponding to the following equation (30) to generate m-bit output data $D_{b\text{-}out}$ when the inverse matrix of said matrix $[H_{ba}]$ is $[H_{ab}]$.

$$D_{b\_out}=[H_{ab}]\times D_{a\_in} \quad \text{Equation 30}$$

The Reed-Solomon decoding device of this invention is one that can handle multiple RS codes using different field-forming polynomials, and there are the following means: a Galois field transformation means that transforms the input coded data into the coded data in of the prescribed Galois field; a decoding means that performs decoding processing of the aforementioned transformed coded data by means of the aforementioned Galois field after transformation; and a Galois field inverse transformation means that undertakes inverse transformation of the aforementioned Galois field of decoded data to the Galois field before transformation.

In the Reed-Solomon decoding device of this invention, by setting the Galois field transformation means and Galois field inverse transformation means, it is possible to perform the decoding processing by means of the prescribed Galois field in the decoding means for any of multiple RS codes. As a result, there is no need to set individual multipliers and inverse element operation units corresponding to all of the multiple RS codes, respectively, and the size of the circuit can be significantly reduced.

In the Reed-Solomon decoding device of this invention, the aforementioned Galois field transformation means preferably has a multiplier corresponding to the aforementioned Galois field after transformation.

Also, for the Reed-Solomon decoding device of this invention, preferably, the aforementioned multiple RS codes are the $RS_a$ code and $RS_b$ code using different field generation polynomials; the coding symbols are Galois fields $GF_a(2^m)$ and $GF_b(2^m)$ extended based on m-th order field generation polynomials $Gp_a(x)$ and $Gp_b(x)$, which are different from each other, on Galois field $GF(2)$, respectively; for $\alpha$ as the root of said $Gp_a(x)$ and as the primitive element of said $GF_a(2^m)$ and for $\beta$ as the root of said $Gp_b(x)$ and as the primitive element of said $GF_b(2^m)$, the following equation (31) is established; said $RS_b$ code has power of t-symbol correction, and its code generation polynomial $G_{cb}(x)$ is represented by the following equation (32); when the aforementioned input coded data are decoded, said Galois field transformation means transforms the Galois field of the aforementioned coded data from said Galois field $GF_b(2^m)$ into said Galois field $GF_a(2m)$; the aforementioned decoding means performs decoding corresponding to the following equation (33) as a polynomial that transforms said code forming polynomial $G_{cb}(x)$ into said Galois field $GF_a(2^m)$; and the aforementioned Galois field inverse transformation means undertakes transformation of the aforementioned Galois field of decoded data from said Galois field $GF_a(2^m)$ into said Galois field $GF_b(2^m)$ $$Gp_b(\alpha^p)=0 \quad \text{Equation 31}$$

Equation 32

$$Gc_b(x) = \prod_{j=0}^{L}(x+\beta^{q(b+j)}), L = 2t-1, \text{ or } 2t \quad (32)$$

Equation 33

$$Gc_{ba}(x) = \prod_{j=0}^{L}(x+\alpha^{pq(b+j)}), L = 2t-1, \text{ or } 2t \quad (33)$$

Also, for the Reed-Solomon decoding device of this invention, preferably, with the transposed matrix represented as $(\ldots)^T$, when m values among the $2^m$ input/output relationships are as follows: with respect to m-bit input $(00 \ldots 0001)^T$, m-bit output $A0=(00 \ldots 001)^T$ is performed, with respect to m-bit input $(00 \ldots 0010)^T$, m-bit output $A_1=(A_{1,m-1}, A_{1,m-2}, \ldots A_{1,0})^T$ is performed, with respect to m-bit input $(00 \ldots 0100)^T$, m-bit output $A_2=(A_{2,m-1}, A_{2,m-2}, \ldots A_{2,0})^T$, is performed, with respect to m-bit input $(01 \ldots 0000)^T$, m-bit output $A_{m-2}=(A_{m-2,m-1}, A_{m-2,m-2}, \ldots A_{m-2,0})^T$ is performed, and with respect to m-bit input $(10 \ldots 00000)^T$, m-bit output $A_{m-1}=(A_{m-1,m-1}, A_{m-1,m-2}, \ldots A_{m-1,0})^T$ is performed, with m by m matrix $[H_{ba}]$ being defined by the following equation (34), the aforementioned Galois field transformation means performs operation processing corresponding to the following equation (35) with respect to said m-bit input data $D_{b\text{-}in}$ to generate m-bit output data $D_{a\text{-}out}$.

$$[H_{ba}]=(A_{m-1}A_{m-2} \ldots A_2A_1A_0) \quad \text{Equation 34}$$

$$D_{a\_out}=[H_{ba}]\times D_{b\_in} \quad \text{Equation 35}$$

Also, for the Reed-Solomon coding device of this invention, preferably, the aforementioned Galois field inverse transformation means performs operation processing corresponding to the following equation (36) to generate m-bit output data $D_{b\text{-}out}$ when the inverse matrix of said matrix $[H_{ba}]$ is $[H_{ab}]$.

$$D_{b\_out}=[H_{ab}]\times D_{a\_in} \quad \text{Equation 36}$$

BRIEF DESCRIPTION OF THE DRAWINGS

FIG. 1 is a schematic diagram illustrating the RS coding/decoding device in an embodiment of this invention.

FIG. 2 is a diagram illustrating the transformation table in the input-side transformation circuit and output-side transformation circuit shown in FIG. 1.

FIG. 3 is a diagram illustrating the constitution of the operation circuit used in the RS coding core unit shown in FIG. 1.

FIG. 4 is a diagram illustrating the constitution of the syndrome operation circuit used in the RS decoding unit shown in FIG. 1.

FIG. 5 is a diagram illustrating the constitution of the divider used in the RS decoding unit shown in FIG. 1.

FIG. 6 is a diagram illustrating the constitution of the multiplier used in the RS decoding unit shown in FIG. 1.

FIG. 7 is a diagram illustrating the constitution of the position-detecting circuit used in the RS decoding core unit shown in FIG. 1.

FIG. 10 is a diagram illustrating the constitution of another example of the RS coding/decoding device in an embodiment of this invention.

FIG. 11 is a schematic diagram illustrating the conventional RS coding/decoding device.

FIG. 15 is a diagram illustrating the constitution of the multiplier used in the conventional RS decoding core unit shown in FIG. 11.

FIG. 16 is a diagram illustrating the constitution of the position-detecting circuit used in the conventional RS decoding core unit shown in FIG. 11.

Figure 8:
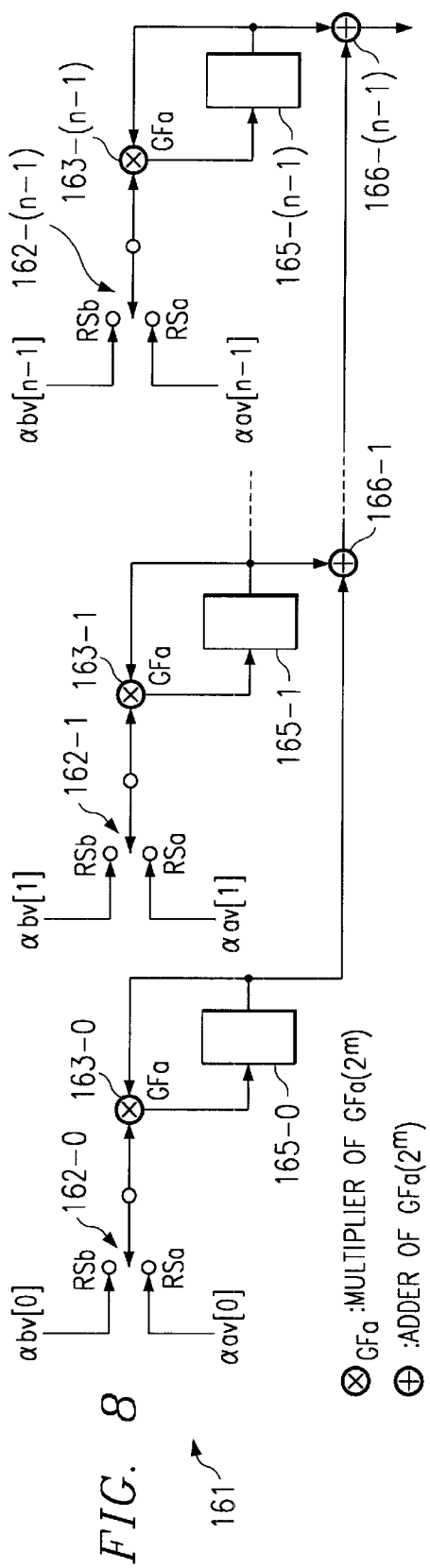
FIG. 8 is a diagram illustrating the constitution of the evaluation value detecting circuit used in the RS decoding core unit shown in FIG. 1.

REFERENCE NUMERALS AND SYMBOLS AS SHOWN IN THE DRAWINGS 101 represents the RS coding/decoding device, 101 the remainder operation circuit, 109 the syndrome operation circuit, 111a to 111x the multiplication coefficient memory unit, 112 the RS coding/decoding core units, 113-0 to 113-L the multipliers, 114, 118, 121 the switches, 115 the inverse element operation circuit, 119a–119x the output-side transformation circuits, 121 the polynomial divider, 141 the polynomial multiplier, 151 the error-position-detecting circuit, 161 the evaluation-value-detecting circuit.

Description of the Embodiments

FIG. 1 is a schematic diagram illustrating RS coding/decoding device 101 in this embodiment.

RS coding/decoding device 101 can handle two or more RS codes, that is, $RS_a$ code, $RS_b$ code, ... $RS_x$ code.

As shown in FIG. 1, there are the following parts: Galois field multiplier 113 corresponding to $GF_a(2^m)$; multiplication coefficient memory units 111a to 111x that store the Galois field multiplication coefficient sets $\{\alpha_{a[I]}\}$, $\{\alpha_{b[J]}\}$, ... $\{\alpha_{x[K]}\}$ corresponding to the various code-forming polynomials, respectively; RS coding/decoding core unit 112; inverse element operation circuit 115; input-side transformation circuits 116b to 116x; output-side transformation circuits 119b to 19x; and switches 114, 118, 121.

As shown in FIG. 1, RS coding/decoding device 101 has a constitution with input-side transformation circuits 116b to 116x and output-side transformation circuits 119b to 119x for the transformation of Galois field attached to the input side and output side of RS coding/decoding unit 112, respectively. Also, in RS coding/decoding unit 112, the multiplication coefficient corresponding to the use of switch 114 is output from multiplication coefficient memory units 111a to 111x. For switch 114, the switch is used by applying a certain RS code.

In RS coding/decoding device 101, when coding of the $RS_a$ code is performed, the data are sent through channels 117, 120 without performing transformation processing in input-side transformation circuits 116b to 116x and output-side transformation circuits 119a to 119x as Galois field transformation circuits. Also, from multiplication coefficient memory unit 111a, multiplication coefficient $\{\alpha_{a[I]}\}$ is output to RS coding/decoding unit 112. In the case of RS decoding, similarly, the same aforementioned input-side transformation circuit and output-side transformation circuit can be used.

In the following, for simplicity, the case of RS coding/decoding device 101 that can handle two RS codes, that is, the $RS_a$ code and $RS_b$ code, will be presented as an example. In this case, for both codes, the correction power is taken as a t-byte correction. In this case, as shown in FIG. 1, input-side transformation circuit 116b and output-side transformation circuit 119b alone are used as the input-side transformation circuit and output-side transformation circuit, respectively. As the multiplication coefficient memory unit, multiplication coefficient memory units 111a and 111b alone are used.

In this embodiment, as an example, RS coding and decoding are performed with q=88 and m=8 in said formulas (25)–(30).

In this embodiment, the main topic is to perform coding/decoding for said $RS_b$ code and to form its device. Consequently, for the aforementioned $RS_a$ code, the only condition required is to have the order number of the field generation polynomial equal to said $RS_b$ code. Also, in order to simplify the explanation of this embodiment, the correction power of said $RS_a$ code is taken as a t-byte correction just as said $RS_b$ code.

$RS_a$ Code

As said $RS_a$ code, the field generation polynomial on GF(2) that defines the coding symbol and forms ground field $GF_{a\text{-}B}(2^8)$ is defined by the following equation (37).

$$Gp_a(x)=x^8+x^4+x^3+x^2+1 \qquad \text{Equation 37}$$

In addition, the code generation polynomial of said $RS_a$ code is defined by the following equation (38).

Equation 38

$$Gc_a(x) = \prod_{j=0}^{L} (x + \alpha^{a+j}), \ L = 2t - 1, \text{ or } 2t \qquad (38)$$

In this case, the coefficient of x is the element of said $GF_{a\text{-}B}(2^8)$, and extension field $GF_{a\text{-}E}(2^8)$ of the code is equal to ground field $GF_{a\text{-}B}(2^8)$. That is, in this embodiment, said Galois field $GF_a(2^8)$ as the object of transformation corresponds to $Gf_{a\text{-}B}(2^8)=Gf_{a\text{-}E}(2^8)$.

Also, $\alpha$ is taken as the root of said $Gp_a(x)$ and as the primitive element over said $GF_a(2^8)=GF_{a\text{-}B}(2^8)$. To simplify the explanation, $\alpha$ is represented by a column vector $(00000010)^T$. Also, from said equation (37), the following equation (39) is established.

$$\alpha^8=\alpha^4+\alpha^3+\alpha^2 1 \qquad \text{Equation 39}$$

Its column vector representation is $(\alpha^8)_a=(00011101)^T$. Here, $(X)_a$ represents the column vector representation of said $GF_a(2^8)$. Also, one has $(\alpha^0)_a=(1)_a=(00000001)^T$.

$RS_b$ Code

As said $RS_b$ code, the field generation polynomial on GF(2) that defines the coding symbol and forms the ground field is defined by the following equation (40).

$$Gp_b(x)=x^8+x^5+x^3+x^2 1 \qquad \text{Equation 40}$$

In addition, said $RS_b$-code generation polynomial is defined by the following equation (41).

Equation 41

$$Gc_b(x) = \prod_{j=0}^{L} (x + \beta^{88(b+j)}), L = 2t-1, \text{ or } 2t \qquad (41)$$

Equation (41) corresponds to the case in which q=88 in said equation (26). Strictly speaking, this RS code is contained in the Goppa code. Consequently, although the coefficient of x of said equation (41) can be represented by the element of said $GF_{b-B}(2^8)$, it is different from $GF_{b-B}(2^8)$ as the ground field of extension field $GF_{b-B}(2^8)$ of the code. In this embodiment, said Galois field $GF_b(2^8)$ as the object of transformation corresponds to $GF_{b-B}(2^8)$. The Euclidean decoding method of the aforementioned Goppa code is described in the reference "Sugiyama, Kasahara, Hirasawa, A method for solving key equation for decoding Goppa codes, Inf. and C ont., 27, 1975," and its erasure correction method is described in detail in the reference "Sugiyama, Kasahara, Hirasawa, Namekawa: An erasures-and-errors decoding algorithm for Goppa codes, IEEE Trans. Infrom. Theory, 1976."

Also, β is taken as the root of said $Gp_b(x)$ and as the primitive element over said $GF_b(2^8)=GF_{b-B}(2^8)$. For simplifying the explanation, β is also represented by the same column vector $(00000010)^T$. Also, from said equation (40), the relationship represented by the following equation (42) is established.

Equation 42

$$\beta^8 = \beta^5 + \beta^3 + \beta^2 + 1 \qquad (42)$$
$$\beta^9 = \beta \times \beta^8 = \beta^6 + \beta^4 + \beta^3 + \beta$$
$$\beta^{10} = \beta \times \beta^9 = \beta^7 + \beta^5 + \beta^4 + \beta^2$$
$$\beta^{11} = \beta \times \beta^{10} = \beta^8 + \beta^6 + \beta^5 + \beta^3$$
$$= \beta^5 + \beta^3 + \beta^2 + 1 + \beta^6 + \beta^5 + \beta^3$$
$$= \beta^6 + \beta^2 + 1$$

Its column vector representation is $(\beta^8)_b=(00101101)^T$. Here, $(X)_b$ represents the column vector representation of said $GF_b(2^8)$. Also, one has $(\beta^0)_b=(1)_b=(00000001)^T$.

For the coding over said $RS_b$ code, it can be realized by performing transformation of the code generation polynomial at the same time as the transformation of the Galois field; the transformation itself is relatively simple.

In the following, an explanation will be made on the various structural elements of RS coding/decoding device 101 and the circuit that forms RS coding/decoding unit 112 shown in FIG. 1.

Input-side Transformation Circuit and Output-side Transformation Circuit

For example, the relationship between α and β may be derived as follows. However, $Gp_a(x)$ is an original polynomial on GF(2), and it has 8 roots of $\alpha, \alpha^2, \alpha^4, \alpha^8, \alpha^{16}, \alpha^{32}, \alpha^{64}, \alpha^{128}$. Similarly, the original polynomial $Gp_{a-p}(x)$ with $\alpha^P$ as a root has a total of 8 roots, including $\alpha^P$ as well as the following roots: $\alpha^{2P}, \alpha^{4P}, \alpha^{8P}, \alpha^{16P}, \alpha^{32P}, \alpha^{64P}, \alpha^{128P}$, and the following equation (43) is established.

$$Gp_{a-p}(x)=(x=\alpha^P)(x+\alpha^{4P})(x+\alpha^{8P})\ldots(x+\alpha^{64P})(x+\alpha^{128P}) \quad \text{Equation 43}$$

Supposing that p=241 in said equation (43), the following equation (44) is established.

$$Gp_{a-p}(x)=\alpha^0 X^8+\alpha^0 x^5+\alpha^0 x^3+\alpha^0 x^2+\alpha^0 \qquad \text{Equation 44}$$

With $\alpha^0=1$ over GF(2), the right-hand side of equation (44) is in agreement with the right-hand side of said equation (40). That is, said $Gp_{a-p}(x)$ and said $Gp_b(x)$ have the same roots on GF(2).

Also, when calculation is performed over said $GF_a(2^8)$, the following equation (45) is established.

$$Gp_b(\alpha^{241})=0 \qquad \text{Equation 45}$$

In this way, $\alpha^{241}$ of said Galois field $GF_a(2^8)$ corresponds to β of said Galois field $GF_b(2^8)$. More specifically, from said equation (45), the following equation (46) is established.

$$(\alpha^{241})^8=(\alpha^{241})^5+(\alpha^{241})^3+(\alpha^{241})^2+1$$
$$(\alpha^{241})^9=\alpha^{241}\times(\alpha^{241})^8=(\alpha^{241})^6+(\alpha^{241})^4+(\alpha^{241})^3+\alpha^{241}$$
$$(\alpha^{241})^{10}=\alpha^{241}\times(\alpha^{241})^9=(\alpha^{241})^7+(\alpha^{241})^5+(\alpha^{241})^4+(\alpha^{241})^2$$
$$(\alpha^{241})^{11}=\alpha^{241}\times(\alpha^{241})^{10}=(\alpha^{241})^6+(\alpha^{241})^2+1 \qquad \text{Equation 46}$$

Based on said equation (46), any element $\alpha^{241}$ of said Galois field $GFa(2^8)$, with z representing any integer, can be represented by a linear combination of $(\alpha^{241})^7, (\alpha^{241})^6, \ldots, (\alpha^{241})^2, \alpha^{241}$ and 1.

That is, in the case of the following equation (47), the relationship of the following equation (48) is established.

Equation 47

$$\beta^z = \sum_{i=0}^{7} B_{z,i}\beta^i \qquad (47)$$

Equation 48

$$\alpha^{241z} = \sum_{i=0}^{7} B_{z,i}\alpha^{241i} \qquad (48)$$

In said formulas (47) and (48), $B_{z,i}=0$ or 1.

In this way, over said $GF_a(2^8)$, $\alpha^{241z}$ behaves just as βz over Galois field $GF_b(2^8)$. From a contrary point of view, βz over said Galois field $GF_b(2^8)$ corresponds to $\alpha^{241z}$ over said Galois field $GF_a(2^8)$.

In input-side transformation circuit 116b, which is transformed from said Galois field $GF_b(2^8)=GF_{b-B}(2^8)$ into said Galois field $GF_a(2^8)=GB_{a-B}(2^8)$, any element βz over $GF_b(2^8)$ is transformed into element $\alpha^{241z}$ over $GF_a(2^8)$, and 0 is transformed to 0 remains 0. According to the rules of operation over said $GF_a(2^8)$, the transformed series defined over said $GF_a(2^8)$ can be used as a multiplier in the RS coding/decoding processing to be explained later. More specifically, this transformation operation is performed for each vector representation. The transformation table of input-side transformation circuit 116b is shown in FIG. 2. Also, in output-side transformation circuit 119b as well, the transformation table shown in FIG. 2 is used.

According to the transformation table shown in FIG. 2, for input-side transformation circuit 116b shown in FIG. 1, there is a ROM that outputs the 8-bit data corresponding to 0, 1, $\alpha^{241}$, $\alpha^{241 \times 2}$, $\alpha^{241 \times 3}$ ... according to the 8-bit address input corresponding to 0, 1, $\beta^1$, $\beta^2$, $\beta^3$ ... .

Also, the series, as a result of processing over said Galois field $GF_a(2^8)$, is transformed into the series of the original Galois field $GF_b(2^8)$ by means of output-side transformation circuit 119b, which transforms any element $\alpha^{241z}$ over $GF_a(2^8)$ to the series of $GF_b(2^8)$ and transforms 0 to 0. Output-side transformation circuit (119b), which is transformed from said Galois field $GF_a(2^8)$ into said Galois field $GF_b(2^8)$, also has a ROM, which outputs 8-bit data corresponding to 0, 1, $\beta^1$, $\beta^2$, $\beta^3$ ... with respect to the 8-bit address input corresponding to 0, 1, $\alpha^{241}$, $\alpha^{241 \times 2}$, $\alpha^{241 \times 3}$ ... by using the transformation table shown in FIG. 2.

Also, with the following equation (49) being established over said Galois field $GF_b(2^8)$, it is possible to obtain the transformation table shown in FIG. 2 with the aforementioned main points.

$$GP_a(\beta^{91})=0 \qquad \text{Equation 49}$$

Said equations (45) and (49) form a pair in the sense that the same transformation table is obtained. In addition, there is also the pair of $Gp_b(\alpha^{31})=0$ and $Gp_a(\beta^{181})$, the pair of $Gp_b(\alpha^{62})$ and $Gp_a(\beta^{218})$, etc. There is a total of 8 groups of pairs. The RS coding/decoding device of this embodiment may adopt the transformation table using any of these pairs.

The aforementioned Galois field transformation may be described even simpler using 8×8 matrices.

Before an explanation of the example, the general rule of the element transformation will be explained.

Theorem 1

The m by m matrix $[H_{ba}(z)]$, which is transformed from Galois field $GF_b(2^m)$ to Galois field $GF_a(2^m)$, is defined by the following equation (50).

$$(\alpha^{pz})a=[H_{ba}(z)](\beta^z)b \qquad \text{Equation 50}$$

In said equation (50), z represents any integer and $(X)_a$ is the column vector representation of element X over said Galois field $GF_a(2^m)$. Similarly, $(Y)_b$ is the column representation of element Y over said Galois field $GF_b(2^m)$. That is, they form mxl matrix; $\alpha$ represents the original element of said Galois field $GF_a(2^m)$, and it is the root of the m-th order field generation polynomial $Gp_a(x)$ on GF(2); $\beta$ represents the original element over said Galois field $GF_b(2^m)$, and it is the root of the m-th order field generation polynomial $Gp_a(x)$ over GF(2), with $(\beta)_b=(000 \ldots 010)^T$.

Also, the following equation (51) is established over $Gp_a(2^m)$.

$$Gp_b(\alpha^p)=0 \qquad \text{Equation 51}$$

In this case, the following equation (52) is established.

$$[H_{ba}(z)]=[H_{ba}]=[(\alpha^{p(m-1)})a(\alpha^{p(m-2)})a \ldots (\alpha^{2p})a(\alpha^{p})a(\alpha^0)a] \qquad \text{Equation 52}$$

That is, said equation (50) is established independently of the value of z.

This "Theorem 1" can be proved as follows.

First of all, with the following equation (53) being established, matrix $[H_{ba}]$ of said equation (52) is used, and the following equation (54) is established.

$$(\beta^0)b=(00 \ldots 001)^T$$
$$(\beta^1)b=(00 \ldots 010)^T$$
$$(\beta^2)b=(00 \ldots 100)^T$$
$$(\beta^{m-2})b=(01 \ldots 000)^T$$
$$(\beta^{m-1})b=(10 \ldots 000)^T \qquad \text{Equation 53}$$

$$(\alpha^0)a=[H_{ba}](\beta^0)b$$
$$(\alpha^p)a=[H_{ba}](\beta^1)b$$
$$(\alpha^{2p})a=[H_{ba}](\beta^2)b$$
$$(\alpha^{p(m-2)})a=[H_{ba}](\beta^{m-2})b$$
$$(\alpha^{p(m-1)})a=[H_{ba}](\beta^{m-1})b \qquad \text{Equation 54}$$

Also, for any element $\beta^z$ over said Galois field $GF_b(2^m)$, the following Equation (55) is established.

Equation 55

$$\beta^z = \sum_{i=0}^{ml} B_{z,i} \beta^i \qquad (55)$$

where $B_{z,i}=0$ or 1, and z represents any integer. As said equation (51) is established, the following equation (56) can be obtained.

Equation 56

$$\alpha^{pz} = \sum_{i=0}^{m-1} B_{z,i} \alpha^{pi} \qquad (56)$$

It can also be derived from said equations (47) and (48) Consequently, for this representation with vectors on both sides, said equation (54) can be broken down to the following equation (57).

Equation 57

$$(\alpha^{pz})a = \sum_{i=0}^{m-1} B_{z,i}(\alpha^{pi})a \qquad (57)$$
$$= \sum_{i=0}^{ml} B_{z,i}[H_{ba}](\beta^i)b$$
$$= [H_{ba}]\sum_{i=0}^{m-1} B_{z,i}(\beta^i)b$$

In addition, when the vector representations on both sides of said equation (55) are substituted into said equation (57), the following equation (58) is obtained.

$$(\alpha^{pz})a=[H_{ba}](\beta^z)b \qquad \text{Equation 58}$$

This is the end of the proof of "Theorem 1."

Also, for $[H_{ba}]$ by said equation (55), the following equation (59) is established with respect to $(0)_a=(000 \ldots 000)^T$ and $(0)_b=(000 \ldots 000)^T$.

$$(0)a=[H_{ba}](0)b \qquad \text{Equation 59}$$

That is, all of the elements over said Galois field $Gp_a(2^m)$ are transformed into all of the elements over said Galois field $Gp_b(2^m)$.

The aforementioned can be summarized as follows: when m values among the $2^m$ input-output relationships in the input-side transformation process include m-bit output $A_0=(00\ldots001)^T$ with respect to m-bit input $(00\ldots0001)^T$, m-bit output $A_1(A_{1,m-1}, A_{1,m-2}, \ldots A_{1,0})^T$, with respect to m-bit input $(00\ldots0001)^T$, m-bit output $A_2=(A_{2,m-1}, A_{2,m-2}, \ldots, A_{2,0})^T$ with respect to m-bit input $(01\ldots0001)^T$, m-bit output $A_{m-2}=(A_{m-2,m-1}, A_{m-2,m-2}, \ldots, A_{m-2,0})^T$ with respect to m-bit input $(10\ldots0000)^T$, and m-bit output $A_{m-1}=(A_{m-1,m-1}, A_{m-1,m-2}, \ldots, A_{m-1,0})^T$ with respect to m-bit input $(10\ldots0000)^T$, the m by m matrix is defined as the following equation (60).

$$[H_{ba}] = (A_{m-1} A_{m-2} \ldots A_2 A_1 A_0) \quad \text{Equation 60}$$

The aforementioned input-side transformation process is realized in the process of calculation by the following equation (61) for m-bit $D_{a\_out}$ with respect to the input m-bit $D_{b\_in}$.

$$D_{a\_out} = [H_{ba}] \times D_{b\_in} \quad \text{Equation 61}$$

Input-side transformation circuit 116 is the device for the input-side transformation process explained in the above.

In the following, when m=1, q=1, and p=241 for said formulas (49)–(57), specific examples will be presented for input-side transformation circuit 116b.

The following equation (62) is established based on the transformation table in FIG. 2.

$$(\alpha^0)a = A_0 = (00000001)^T$$
$$(\alpha^{241})a = A_1 = (01011000)^T$$
$$(\alpha^{241\times2})a = A_2 = (10010000)^T$$
$$(\alpha^{241\times3})a = A_2 = (11110010)^T$$
$$(\alpha^{241\times4})a = A_6 = (00001110)^T$$
$$(\alpha^{241\times5})a = A_2 = (00110111)^T$$
$$(\alpha^{241\times6})a = A_6 = (10110011)^T$$
$$(\alpha^{241\times7})a = A_7 = (11010101)^T \quad \text{Equation 62}$$

Consequently, from said equation (60), the following equation (63) is established.

Equation 63

$$[H_{ba}] = \begin{pmatrix} (A_7 & A_6 & \ldots & A_2 & A_1 & A_0) \\ 1 & 1 & 0 & 0 & 1 & 1 & 0 & 0 \\ 1 & 0 & 0 & 0 & 1 & 0 & 1 & 0 \\ 0 & 1 & 1 & 0 & 1 & 0 & 0 & 0 \\ 1 & 1 & 1 & 0 & 1 & 1 & 1 & 0 \\ 0 & 0 & 0 & 1 & 0 & 0 & 1 & 0 \\ 1 & 0 & 1 & 1 & 0 & 0 & 0 & 0 \\ 0 & 1 & 1 & 1 & 1 & 0 & 0 & 0 \\ 1 & 1 & 1 & 0 & 0 & 0 & 0 & 1 \end{pmatrix} \quad (63)$$

In this case, with the input-output relationship represented by said equation (61) becoming the following equation (65) and with the following equation (64) representing each bit, the following equation (66) is established.

$$D_{b\_out} = (d_{b\_o7} d_{b\_o6} d_{b\_o5} d_{b\_o4} d_{b\_o3} d_{b\_o2} d_{b\_o1} d_{b\_o0})^T$$

$$D_{a\_in} = (d_{a\_i7} d_{a\_i6} d_{a\_i5} d_{a\_i4} d_{a\_i3} d_{a\_i2} d_{a\_i1} d_{a\_i0})^T \quad \text{Equation 64}$$

Equation 65

$$\begin{pmatrix} d_{b\_o7} \\ d_{b\_o6} \\ d_{b\_o5} \\ d_{b\_o4} \\ d_{b\_o3} \\ d_{b\_o2} \\ d_{b\_o1} \\ d_{b\_o0} \end{pmatrix} = \begin{pmatrix} 1 & 1 & 0 & 0 & 1 & 1 & 0 & 0 \\ 1 & 0 & 0 & 0 & 1 & 0 & 1 & 0 \\ 0 & 1 & 1 & 0 & 1 & 0 & 0 & 0 \\ 1 & 1 & 1 & 0 & 1 & 1 & 1 & 0 \\ 0 & 0 & 0 & 1 & 0 & 0 & 1 & 0 \\ 1 & 0 & 1 & 1 & 0 & 0 & 0 & 0 \\ 0 & 1 & 1 & 1 & 1 & 0 & 0 & 0 \\ 1 & 1 & 1 & 0 & 0 & 0 & 0 & 1 \end{pmatrix} = \begin{pmatrix} d_{a\_i7} \\ d_{a\_i6} \\ d_{a\_i5} \\ d_{a\_i4} \\ d_{a\_i3} \\ d_{a\_i2} \\ d_{a\_i1} \\ d_{a\_i0} \end{pmatrix} \quad (65)$$

$d_{b\_o7} = d_{a\_i7} \text{XOR } d_{a\_i6} \text{XOR } d_{a\_i3} \text{XOR } d_{a\_i2}$ $d_{b\_o6} = d_{a\_i7} \text{XOR } d_{a\_i3} \text{XOR } d_{a\_i1}$ $d_{b\_o5} = d_{a\_i6} \text{XOR } d_{a\_i5} \text{XOR } d_{a\_i3}$ $d_{b\_o4} = d_{a\_i7} \text{XOR } d_{a\_i6} \text{XOR } d_{a\_i5} \text{XOR } d_{a\_i3} \text{XOR } d_{a\_i2} \text{XOR } d_{a\_i1}$ $d_{b\_o3} = d_{a\_i4} \text{XOR } d_{a\_i1}$ $d_{b\_o2} = d_{a\_i7} \text{XOR } d_{a\_i5} \text{XOR } d_{a\_i4}$ $d_{b\_o1} = d_{a\_i6} \text{XOR } d_{a\_i5} \text{XOR } d_{a\_i4} \text{XOR } d_{a\_i3}$ $d_{b\_o0} = d_{a\_i7} \text{XOR } d_{a\_i6} \text{XOR } d_{a\_i5} \text{XOR } d_{a\_i0} \quad \text{Equation 66}$ Here, XOR represents exclusive-OR. Consequently, input-side transformation circuit 116 that performs transformation of said equation (66) can be realized by as many as 21 XOR gates.

In the following, an explanation will be made on output-side transformation circuit 119.

It is possible to derive matrix $[H_{ab}]$ corresponding to the output-side transformation operation by means of the inverse operation from the transformation table shown in FIG. 2. Also, it is possible to derive it directly from $[H_{ba}]$ that has been derived.

That is, in the output-side transformation process, with respect to input m-bit $D_{a\_in}$ corresponding to the element over said Galois field $Gp_a(2^m)$, output m-bit $D_{b\_out}$ corresponding to the element over said Galois field $Gp_b(2^m)$ is obtained. In generalized equation (61), when $D_{a\_out}$ is substituted by $D_{a\_in}$, and $D_{b\_in}$ is substituted by $D_{b\_out}$, the following equation (67) is established.

Consequently, $$D_{a\_in} = [H_{ba}] \times D_{b\_out} \quad \text{Equation 67}$$

When inverse matrix $[H_{ba}]^{-1}$ of $[H_{ba}]$ is multiplied from the left side on both sides of said equation (61), the following equation (68) is obtained.

Equation 68

$$[H_{ba}]^{-1} \times D_{a\_in} = [H_{ba}]^{-1} [H_{ba}] \times D_{a\_out} \quad (68)$$
$$= D_{b\_out}$$

Consequently, supposing one has the following equation (69), one thus obtains the following equation (70).

$$[H_{ab}] = [H_{ba}]^{-1} \quad \text{Equation 69}$$

$$D_{b\_out} = [H_{ab}] \times D_{a\_in} \quad \text{Equation 70}$$

As a specific example, from $[H_{ba}]$ of said equation (63), the following equation (71) is obtained.

Equation 71

$$[H_{ab}] = [H_{ba}]^{-1} = \begin{pmatrix} 1 & 0 & 0 & 1 & 1 & 1 & 0 & 0 \\ 0 & 1 & 1 & 0 & 1 & 1 & 0 & 0 \\ 1 & 0 & 1 & 1 & 1 & 0 & 1 & 0 \\ 0 & 0 & 1 & 0 & 0 & 0 & 1 & 0 \\ 1 & 1 & 1 & 1 & 0 & 1 & 1 & 0 \\ 1 & 0 & 0 & 0 & 0 & 1 & 1 & 0 \\ 0 & 0 & 1 & 0 & 1 & 0 & 1 & 0 \\ 0 & 1 & 0 & 0 & 1 & 0 & 1 & 1 \end{pmatrix} \quad (71)$$

Similarly, based on said matrix [$H_{ab}$], output-side transformation circuit 119 can be realized.

In this way, when m=8, the aforementioned input circuit and the aforementioned output transformation circuit can be realized directly by tens of XOR gates, respectively, and the number of gates is in the range of tens to about 100 for each of them.

RS Coding/Decoding Core Unit

In the following, a detailed explanation will be presented on each of the circuits that form RS coding/decoding core unit 112.

Remainder Operation Circuit

In the following, the embodiment of the polynomial's remainder operation circuit as a principal structural element of the RS coding device will be presented. FIG. 1 illustrates the case in which the RS coding/decoding core unit has an RS coding function. The Galois field multiplier that form the polynomial remainder operation circuit originally is present corresponding to the $RS_a$ code. When coding of the $RS_b$ code is to be performed, because data sequence of $D_a$-out transformed by input-side transformation circuit 116b corresponds to the element over Galois field $Gp_a(2^m)$, the multiplication operation of the Galois field follows the multiplication rule on $Gp_a(2^m)$. Consequently, it is possible to make use of the same multiplier to perform coding of the $RS_b$ code.

However, as aforementioned, because element Liz over $Gp_b(2^m)$ corresponds to $\beta^{pz}$ on $G_{pa}(2^m)$, transformation pertaining to the multiplication coefficient of the Galois field over $Gp_a(2^m)$ is needed. That is, for any integers u and v, multiplication over the Galois field shown by the following equation (72) over said $G_{pb}(2^m)$ corresponds to the following equation (73) over $G_{pa}(2^m)$.

$$\beta^u \times \beta^v = \beta^{u+v} \qquad \text{Equation 72}$$

$$\alpha^{pu} \times \alpha^{pv} = \alpha^{p(u+v)} \qquad \text{Equation 73}$$

Clearly, the division operation of the Galois field is similar as aforementioned. Also, for addition (=subtraction) of the Galois field, with reference to said equations (55) and (56), in the case of the following equation (74), the following equation (75) is established based over $G_{pa}(2^m)$.

Equation 74

$$\begin{aligned} \beta^u + \beta^v &= \sum_{i=0}^{m-1} Bu, i, \beta^i + \sum_{i=0}^{m-1} Bv, i, \beta^i \\ &= \sum_{i=0}^{m-1} (Bu, i + Bv, i)\beta^i \\ &= \sum_{i=0}^{m-1} Bw, i \beta^i \\ &= \beta^w \end{aligned} \qquad (74)$$

Equation 75

$$\begin{aligned} \alpha^{pu} + \alpha^{pv} &= \sum_{i=0}^{m-1} Bu, i, \alpha^{pi} + \sum_{i=0}^{m-1} Bv, i, \alpha^{pi} \\ &= \sum_{i=0}^{m-1} (Bu, i + Bv, i)\alpha^{pi} \\ &= \sum_{i=0}^{m-1} Bw, i \alpha^{pi} \\ &= \alpha^{pw} \end{aligned} \qquad (75)$$

In this way, usually, for equation F(x)=0 including any arithmetic operation of the Galois field, F($\beta$)=0 over $GF_b$ ($2^m$) corresponds to F($\alpha^p$)=0 over $GF_a(2^m)$.

Figure 12:
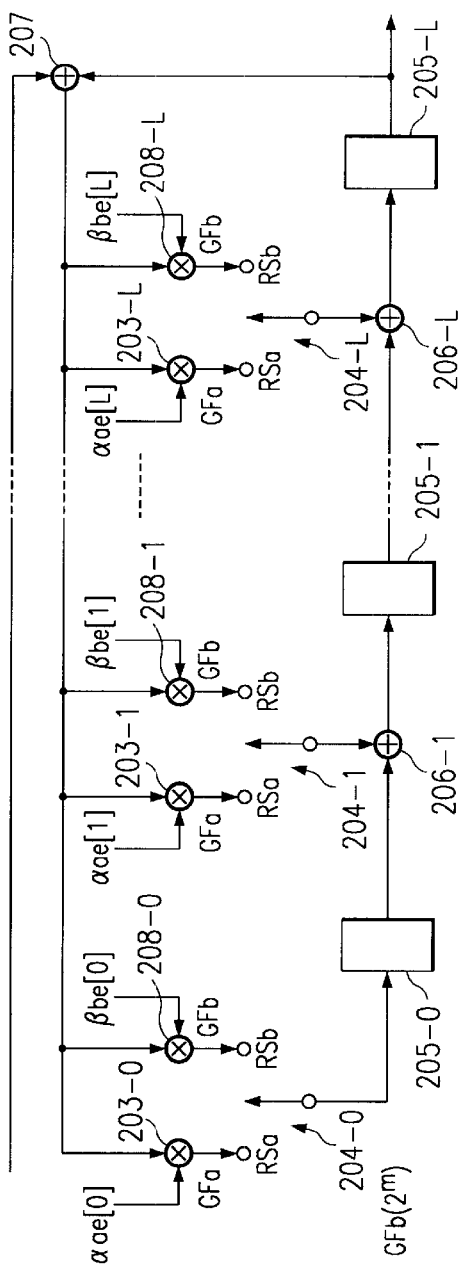
FIG. 12 is a diagram illustrating the constitution of the modulo operation circuit used in the conventional RS coding core unit shown in FIG. 11.
Figure 13:
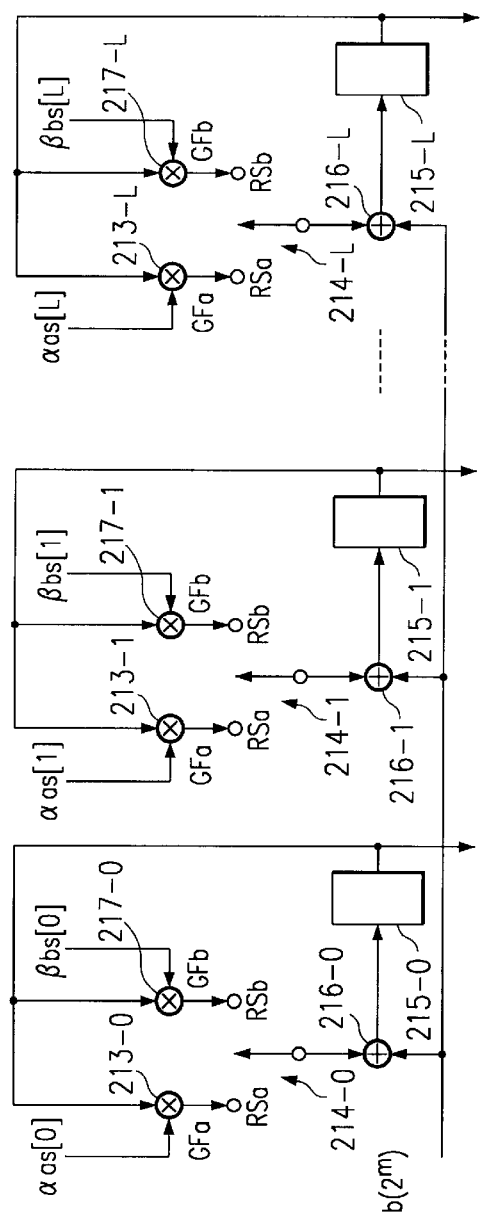
FIG. 13 is a diagram illustrating the constitution of the syndrome circuit used in the conventional RS decoding core unit shown in FIG. 11.

In the process of RS coding, the polynomial remainder operation process is contained by means of the code generation polynomial. For the multiplication coefficient in the polynomial remainder operation circuit of the coding device of the conventional $RS_b$ code shown in FIG. 12, the relationship represented by equation (76) is established.

Equation 76

$$\begin{aligned} \{\beta_{be[j]}\} &= \{\beta_{be[0]}, \beta_{be[1]}, \beta_{be[2]}, \cdots \beta_{be[L-1]}, \beta_{be[L]}\} \\ &= \beta^{e[0]}, \beta^{e[1]}, \beta^{e[2]}, \ldots \beta^{e[L-1]}, \beta^{e[L]}\} \end{aligned} \qquad (76)$$

That is, equation (77) is established.

Equation 77

$$\begin{aligned} Gcb(x) &= \prod_{j=0}^{L}(x + \beta^{q(b+j)}) \\ &= \beta^{e[L]}x^L + \beta^{e[L-1]}x^{L-1} + \ldots \beta^{e[2]}x^2 + \\ &\quad \beta^{e[1]}x^1 + \beta^{e[0]}x^0 \end{aligned} \qquad (77)$$

Here, L=2t−1 or 2t. From the relationship between said equation and equations (72) to (75), the set $\{\alpha_{be[j]}\}$ of the corresponding Galois field over $GF_a(2^m)$ should be as in the following equation (78).

Equation 78

$$\begin{aligned} \{\alpha_{be[j]}\} &= \{\alpha_{be[0]}, \alpha_{be[1]}, \alpha_{be[2]}, \cdots \alpha_{be[L-1]}, \alpha_{be[L]}\} \\ &= \alpha^{p \times e[0]}, \alpha^{p \times e[1]}, \alpha^{p \times e[2]}, \ldots \alpha^{p \times e[L-1]}, \alpha^{p \times e[L]}\} \end{aligned} \qquad (78)$$

In this case, corresponding code generation polynomial $G_{cba}(x)$ becomes the following equation (79).

Equation 79

$$Gc_{ba}(x) = \alpha^{p \times e[L]}x^L + \alpha^{p \times e[L-1]}x^{L-1} + \ldots \alpha^{p \times e[2]}x^2 + \quad (79)$$
$$\alpha^{p \times e[1]}x^1 + \alpha^{p \times e[0]}x^0$$
$$= \prod_{j=0}^{L}(x + \alpha^{pq(b+j)})$$

That is, the polynomial remainder operation circuit in the RS coding device that can handle the two RS codes in this embodiment becomes that shown in FIG. 3.

As shown in FIG. 3, remainder operation circuit 102 has multipliers 103-0 to 103-L, switches 104-0 to 104-L, registers 105-0 to 105-L, and adders 106-0 to 106-L.

For multipliers 103-0 to 103-L, corresponding multiplication coefficients $\{\alpha_{be[j]}\}$ and multiplication coefficients $\{\alpha_{ae[j]}\}$ are selectively input by switches 104-0 to 104-L. The multiplication results of the selected multiplication coefficients and input data are output to registers 105-0 to 105-L. More specifically, when $RS_a$ coding is performed, by means of switches 104-0 to 104-L, multiplication coefficients $\{\alpha_{ae[j]}\}$ are output to multipliers 103-0 to 103-L, then multiplication of multiplication coefficient $\{\alpha_{ae[j]}\}$ and input data is carried out. On the other hand, when $RS_b$ coding is performed, by means of switches 104-0 to 104-L, multiplication coefficients $\{\alpha_{be[j]}\}$ are output to multipliers 103-0 to 103-L, then multiplication of multiplication coefficient $\{\alpha_{be[j]}\}$ and input data is performed.

Here, multiplication coefficient $\{\alpha_{be[j]}\}$ is a set of the multiplication coefficient of the Galois field of the remainder operation of the polynomial corresponding to code generation polynomial $G_{cba}$ shown in said equation (79). Also, multiplication coefficient $\{\alpha_{ae[j]}\}$ is a set of the multiplication coefficient of the Galois field of the remainder operation of the polynomial corresponding to code generation polynomial $G_{cba}$ shown in said equation (38). In FIG. 3, multipliers 103-0 to 103-L of the Galois field are multipliers over $GF_a(2^m)$, and adders 106-0 to 106-L of the Galois field are adders over $GF_a(2^m)$.

Consequently, in the originally present polynomial remainder operation circuit corresponding to the $RS_a$ code, it is possible to realize the polynomial remainder operation circuit corresponding to the $RS_a$ code and that corresponding to the $RS_b$ code at the same time by simply switching the multiplication coefficient of the Galois field. Also, this embodiment can be adopted for coding of the different RS codes of three or more field generation polynomials as shown in FIG. 1. Also, it is considered that 0 is contained in the aforementioned set $\{\beta_{be[j]}\}$. However, since $0^p=0$, the element of said assembly $\{\alpha_{be[j]}\}$ corresponding to it is also 0, and the corresponding code generation polynomial $G_{cba}(x)$ is still represented by said equation (79). Also, strictly speaking, this code generation polynomial is contained in the Goppa code.

For the example with m=8, q=88, and p=241, more specifically, assuming that b=120 and L=15 in said equation (78), the following equations (80) and (81) are obtained.

Equation 80

$$Gc_b(x) = \prod_{j=0}^{15}(x + \beta^{88(120+j)}) \quad (80)$$
$$= \beta^0 x^{15} + \beta^{30} x^{14} + \ldots + \beta^{230} x^2 + \beta^{30} x^1 + \beta^0 x^0$$

$$\{\beta_{be[j]}\} = \{\beta^0, \beta^{30}, \beta^{230}, \ldots \beta^{30}, \beta^0\} \quad \text{Equation 81}$$

On the other hand, the following equation (82) and equation (83) are established.

Equation 82

$$Gc_{ba}(x) = \prod_{j=0}^{15}(x + \alpha^{241 \times 88(120+j)}) \quad (82)$$
$$= \alpha^0 x^{15} + \alpha^{90} x^{14} + \ldots + \alpha^{95} x^2 + \alpha^{90} x^1 + \alpha^0 x^0$$

$$\{\alpha_{be[j]}\} = \{\alpha^0 = \alpha^{241 \times 0}, \alpha^{90} = \alpha^{241 \times 30}, \alpha^{95} = \alpha^{241 \times 230}, \ldots {}^{90} = \alpha^{241 \times 30}\} \quad \text{Equation 83}$$

In this way, said equations (76)–(79) are embodied.

In this embodiment, it is possible to cause the Galois field multiplier with a relatively large circuit scale to be shared for the coding of both the $RS_a$ code and $RS_b$ code. More specifically, in the conventional technology, for coding of the $RS_b$ code, if L=2t-1, additional 2t Galois field multipliers are needed. In this embodiment of this invention, these new multipliers are not needed. Instead, it is only necessary to switch the multiplication coefficients of the Galois field for performing a division operation of the polynomial. When m=8, the multiplier of the Galois field can be realized by 300–400 gates. Consequently, in this application example, when t=8, it is possible to reduce the number of gates in thousands.

Also, as far as the Galois field addition rule is concerned, for both Galois fields, because their field generation polynomials over the same GF(2) become the grounds of their respective Galois fields, respectively, the same addition rule can be adopted.

RS Decoding

In the following, an explanation will be presented on the embodiment in which the aforementioned RS coding/decoding core unit has an RS decoding function. In the case of RS decoding device, the Galois field transformation circuit in input/output is used in the same way. Because RS decoding has a constitution that is the sum of multiplications of the Galois fields, as well as a multiplication or divider of polynomials, it is possible to realize the shared Galois field multipliers for the RS decoding device that can handle two or more RS codes. That is, it has the set $\{\alpha_{a[I]}\}$ of Galois field multiplication coefficients corresponding to the decoding of the $RS_a$ code and set $\{\alpha_{b[I]}\}$ of Galois field multiplication coefficients corresponding to the decoding of the $RS_b$ code; the sets $\{\alpha_{a[I]}\}$ and $\{\alpha_{b[I]}\}$ of the Galois field multiplication coefficients are switched for use depending on whether decoding of the $RS_a$ code or of the $RS_b$ code is to be performed. Decoding of the $RS_b$ code is performed based on said equation (79) over $GF_a(2^m)$. That is, although strictly speaking the decoding of the Goppa code is carried out, as far as the scheme is concerned, for example, the Euclidean decoding method can be used.

Syndrome Operation Circuit

FIG. 4 is a diagram illustrating the embodiment of syndrome operation circuit 109 that can handle said two RS codes. In this case, set $\{\alpha_{as[i]}\}$, I=0~L of Galois field multiplication coefficients is contained in said $\{\alpha_{a[I]}\}$. Also, set $\{\alpha_{bs[j]}\}$, j=0~L of Galois field multiplication coefficients is contained in said $\{\alpha_{b[J]}\}$. In addition, for $RS_b$ code, as an example, for m=8, q=88, p=241, b=120, L=15, the following equation (84) is presented.

Equation 84

$$\{\alpha_{bs[j]}\} = \{\alpha_{bs[0]}, \alpha_{bs[1]}, \alpha_{bs[2]}, \ldots \alpha_{bs[L-1]}, \alpha_{bs[L]}\} \quad (84)$$
$$= \{\alpha^{241 \times 88 \times 120}, \alpha^{241 \times 88 \times 121}, \alpha^{241 \times 88 \times 122}, \ldots \alpha^{241 \times 88 \times 134}, \alpha^{241 \times 88 \times 135}\}$$
$$= \{\alpha^{60}, \alpha^{103}, \alpha^{146}, \ldots \alpha^{152}, \alpha^{195}\}$$

As shown in FIG. 4, syndrome operation circuit 109 has multipliers 113-0 to 113-L, switches 114-0 to 114-L, registers 115-0 to 115-L, and adders 116-0 to 116-L.

For multipliers 113-0 to 113-L, the corresponding multiplication coefficients $\{\alpha_{bs[j]}\}$ and multiplication coefficient $\{\alpha_{as[j]}\}$ are selected for input by means of switches 114-0 to 114-L. The results of multiplication of the selected multiplication coefficient and the data from registers 115-0 to 115-L are output to adders 116-0 to 116-L. More specifically, when $RS_a$ coding is performed, by means of switches 114-0 to 114-L, various multiplication coefficients $\{\alpha_{as[j]}\}$ are output to multipliers 113-0 to 113-L, and multiplication is performed for multiplication coefficient $\{\alpha_{as[j]}\}$ and the data from registers 115-0 to 115-L. On the other hand, when $RS_b$ coding is performed, by means of switches 114-0 to 114-L, multiplication coefficients $\{\alpha_{bs[j]}\}$ are output to multipliers 113-0 to 113-L, and multiplication is performed for multiplication coefficient $\{\alpha_{bs[j]}\}$ registers 115-0 to 115-L.

Here, multiplication coefficient $\{\alpha_{as[j]}\}$ is a set of the Galois field multiplication coefficients of the syndrome operation corresponding $RS_a$. Also, multiplication coefficient $\{\alpha_{be[j]}\}$ is a set of Galois field multiplication coefficients of the syndrome operation corresponding to $RS_b$. In FIG. 4, Galois field multipliers 113-0 to 113-L are multipliers over $GF_a(2^m)$, and Galois field's adders 116-0 to 116-L are adders over $GF_a(2^m)$.

Divider of Polynomial

FIG. 5 is a diagram illustrating the embodiment of polynomial divider 121 as a principal structural element of the error-position polynomial and evaluation polynomial operation circuit corresponding to the aforementioned two RS codes.

As shown in FIG. 5, polynomial divider 121 has multipliers 123-0 to 123-L, registers 124-0 to 124-L, registers 125-0 to 125-L, registers 127, 129, adders 126-0 to 126-L, multiplier/adder 130, and inverse operation circuit 131.

Figure 14:
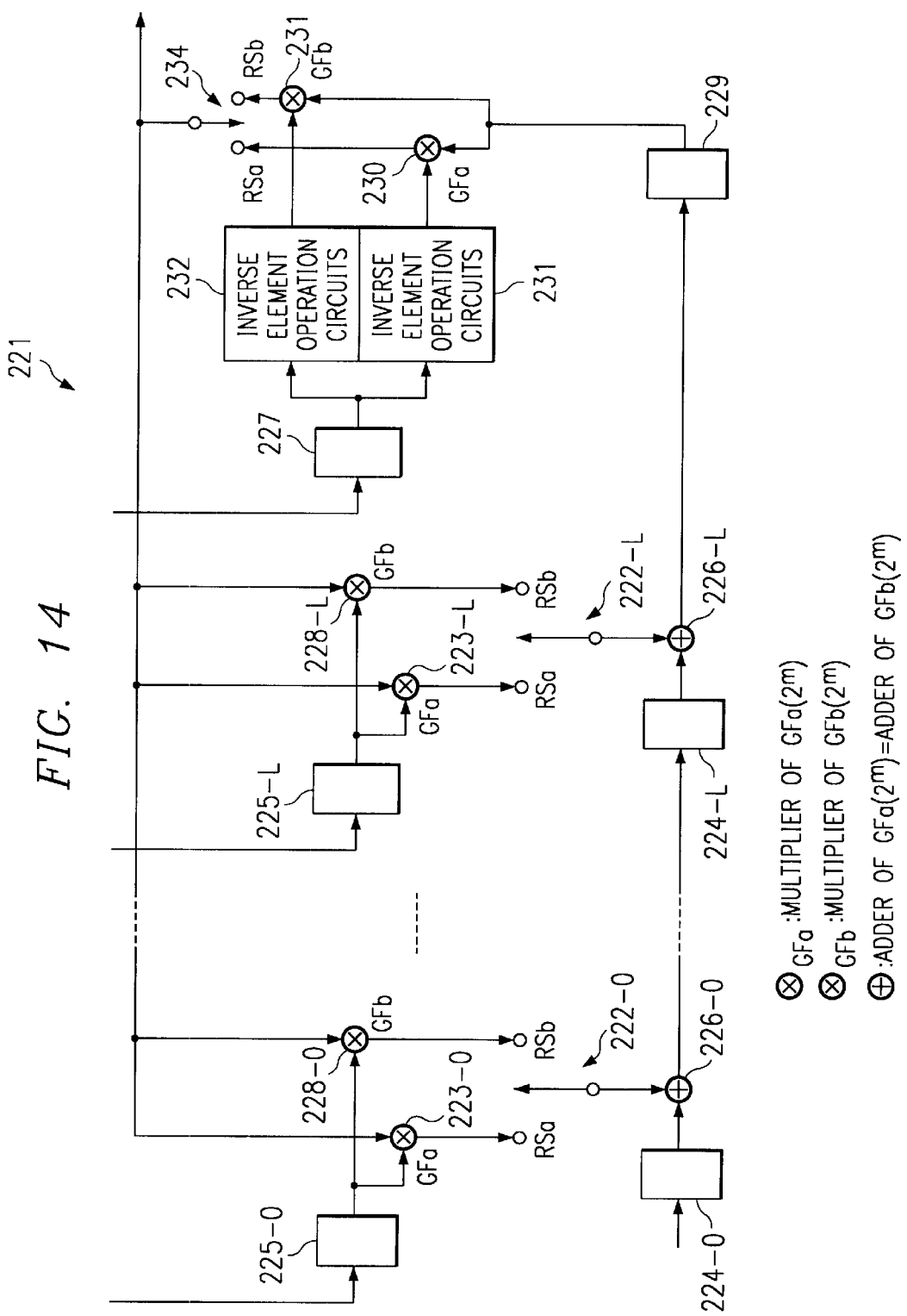
FIG. 14 is a diagram illustrating the constitution of the divider used in the conventional RS decoding core unit shown in FIG. 11.
Figure 17:
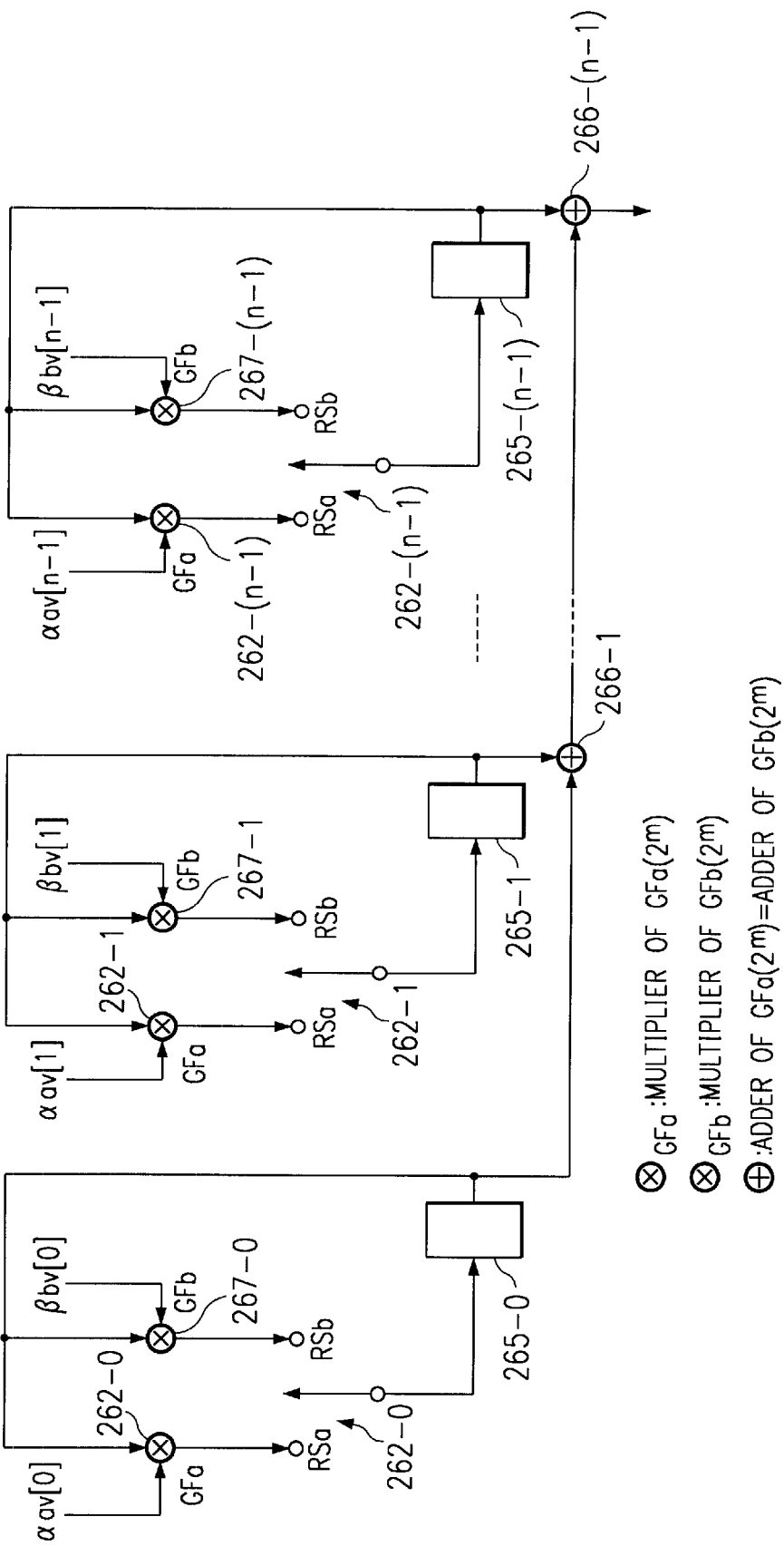
FIG. 17 is a diagram illustrating the constitution of the evaluation value detecting circuit used in the conventional RS decoding core unit shown in FIG. 11.

Here, as can be seen from a comparison with the conventional polynomial divider shown in FIG. 14, there is no need of switching for the Galois field multipliers. Also, there may be only one inverse element operation circuit. That is, when the correction power is the same for the aforementioned two RS codes, they can be entirely realized in the same circuit.

Polynomial Multiplier

FIG. 6 is a diagram illustrating the embodiment of polynomial multiplier 141 as a principal structural element of the error-position polynomial and evaluation polynomial operation circuit corresponding to the aforementioned two RS codes.

As shown in FIG. 6, polynomial multiplier (141) has multipliers 143-0 to 143-L, registers 145-0 to 145-L, adders 146-0 to 146-L, and registers 147-0 to 147-L.

Using polynomial multiplier 141, multiplication is performed according to the multiplication rule over $GP_a(2^m)$. Consequently, when the correction power is the same for the aforementioned two RS codes, the number of the Galois field multipliers can be halved as compared with the conventional polynomial multipliers.

Error-position Detecting Circuit

In the conventional algorithm of the Chien Search, detection of the error-position is performed as follows: values of $\beta^{-qk}$ corresponding to positions k are substituted in order into error-position polynomial $\sigma_b(x)$ represented by the following equation (85) derived using the aforementioned error-position polynomial operation circuit, as shown by the following equation (86), if the value becomes 0, it is judged that an error is present at said position k. When erasure correction is performed, n=2t; when erasure correction is not performed, n=t.

$$\sigma_b(x) = \sigma_{b[n]}x^n + \sigma_{b[n-1]}x^{n-1} + \ldots + \sigma_{b[2]}x^2 + \sigma_{b[1]}x^1 + \sigma_{b[0]}x^0 \quad \text{Equation 85}$$

$$\sigma_b(\beta^{-qk}) = 0 \quad \text{Equation 86}$$

In this embodiment, $\beta^{-qk}$ corresponding to said error-position k is equivalent to $\alpha^{p(-qk)}$ over Galois field $Gp_a(2^m)$. For the arithmetic operations, there are the relationships of said equations (72)–(75). Consequently, in this embodiment, the error-position polynomial is represented by the following equation (87).

$$\sigma(x) = \sigma_n x^n + \sigma_{n-1} x^{n-1} + \ldots + \sigma_2 x^2 + \sigma_1 x^1 + \sigma_0 x^0 \quad \text{Equation 87}$$

Here, when the coefficient over Galois field $GF_b(2^m)$ of said equation (86) is $\sigma_{b[j]} = \beta^{c[j]}$ or 0, the coefficient over Galois field $GF_a(2^m)$ of said equation (86) is $\sigma j = \alpha^{pc[j]}$ or 0. Consequently, for k, for which said equation (85) is established, the following equation (88) is established.

Equation 88

$$\sigma(\alpha^{-pqk}) = 0 \quad (88)$$

In this embodiment, error exists at position k, where equation (88) is established. Also, the same conclusion is obtained when decoding of the Goppa code using the code generation polynomial of said equation (79) is considered as performed using the method described in the aforementioned reference.

FIG. 7 is a diagram illustrating the constitution of error-position detecting circuit 151 in this embodiment corresponding to the aforementioned two RS codes. Error-position detecting circuit 151 is for realizing the algorithm of Chien search corresponding to said equation (87). It is possible to handle the aforementioned two RS codes by simply switching the coefficients. In this case, when the erasure correction is not performed, n=t; set $\{\alpha_{ac[I]}\}$, I=0~t of the Galois field multiplication coefficients is contained in said $\{\alpha_{a[I]}\}$, and set $\{\alpha_{bc[i]}\}$, i=0~t of the Galois field multiplication coefficients is contained in said $\{\alpha_{b[J]}\}$.

As shown in FIG. 7, error-position detecting circuit 151 has switches 152-0 to 152-n, multipliers 153-0 to 153-n, registers 155-0 to 155-n, adders 156-0 to 156-n, and 0-detecting circuit 157. In error-position detecting circuit 151, based on the detection result of 0-detecting circuit 157, error-position k is derived.

Here, multipliers 153-0 to 153-n are multipliers of $GF_a(2^m)$, and adders 156-1 to 156-n are adders of $GF_a(2^m)$.

For the $RS_b$ code, in the example with m=8, q=88, p=241, b=120, L=15 (t=8), the following equation (89) is established.

Equation 89

$$\{\alpha_{bc[j]}\} = \{\alpha_{bc[0]}, \alpha_{bc[1]}, \alpha_{bc[2]}, \ldots \alpha_{bc[n-1]}, \alpha_{bc[n]}\} \quad (89)$$
$$= \{\alpha^{241\times88\times255}, \alpha^{241\times88\times254}, \alpha^{241\times88\times253}, \ldots$$
$$\alpha^{241\times88\times246}, \alpha^{241\times88\times247}\}$$

As the initial values of the various registers, coefficients $\sigma_0 - \sigma_n$ of said equation (87) are set, and the values corresponding to the left-hand side of said equation (88) can be calculated successively corresponding to k=0, 1, 2 . . . Also, when erasure correction is performed using the $RS_b$ code, j=0~2t (that is, n=2t).

Evaluation Value Detecting Circuit

In order to make error correction, in addition to error-position k, it is necessary to derive error magnitude $e_k$. The evaluation function is as in the following equation (90).

$$\eta(x) = \eta_{n-1} x^{n-1} + \eta_{n-2} x^{n-2} + \ldots + \eta_2 x^2 + \eta_1 x^1 + \eta_0 x^0 \quad \text{Equation 90}$$

Supposing that the derivative function of the aforementioned position polynomial is $\sigma'(x)$, when the decoding of the Goppa code by the code generating polynomial of said equation (79) is carried out according to the aforementioned reference, the magnitude of the aforementioned error is represented by the following equation (91).

Equation 91

$$e_k = \frac{\alpha^{pq(b-1)(-k)} \eta(\alpha^{-pq k})}{\sigma'(\alpha^{-pq k})} \quad (91)$$

FIG. 8 illustrates an application example of the proposed evaluation value detecting circuit that can handle the aforementioned two RS codes.

As can be seen from FIG. 8, evaluation value detecting circuit 161 has switches 162-0 to 162-(n-1), multipliers (163-0) to (163-(n-1)), registers 165-0 to 165-(n-1), and adders 166-1 to 166-(n-1).

Here, when the erasure correction is not carried out, n=t, and set $\{\alpha_{av[j]}\}$, i=0~t of the Galois field multiplication coefficients is contained in said $\{\alpha_{a[j]}\}$; set $\{\alpha_{bv[j]}\}$, j=0~t-1 of the Galois field multiplication coefficients is contained in said $\{\alpha_{b[j]}\}$.

For multipliers 163-0 to 163-(n-1), by means of switches 162-0 to 162-(n-1), multiplication coefficient $\{\alpha_{bv[j]}\}$ and multiplication coefficients $\{\alpha_{av[j]}\}$ are selectively input, then multiplication of the selected multiplication coefficient and the data from registers 165-0 to 165-(n-1) is carried out. More specifically, when $RS_a$ decoding is carried out, by means of switches 162-0 to 162-(n-1), multiplication coefficients $\{\alpha_{av[j]}\}$ are output to multipliers 163-0 to 163-(n-1), then multiplication of multiplication coefficients $\{\alpha_{av[j]}\}$ and the data from registers 165-0 to 165-(n-1) is carried out. On the other hand, when $RS_b$ decoding is carried out, by means of switches 162-0 to 162-(n-1), multiplication coefficients $\{\alpha_{bv[j]}\}$ are output to multipliers 163-0 to 163-(n-1), then multiplication of multiplication coefficient $\{\alpha_{bv[j]}\}$ and the data from registers 165-0 to 165-(n-1) is performed.

For the $RS_b$ code, as an example with m=8, q=88, p=241, b=120, and L=15(t=8), one has the following equation (92):

Equation 92

$$\{\alpha_{bv[j]}\} = \{\alpha_{bv[0]}, \alpha_{bv[1]}, \alpha_{bv[2]}, \ldots \alpha_{bv[t-2]}, \alpha_{bv[t-1]}\} \quad (92)$$
$$= \{\alpha^{241\times88\times255}, \alpha^{241\times88\times254}, \alpha^{241\times88\times253}, \ldots$$
$$\alpha^{241\times88\times249}, \alpha^{241\times88\times248}\}$$

As the initial values of the registers, coefficients of said equation (87) are set as $\eta \sim \eta_{t-1}$, and the values of $\eta(\alpha^{-pqk})$ of said equation (91) corresponding to k=0, 1, 2 . . . can be derived successively in the same way.

Also, with the value of the numerator in said equation (91) is represented by equation (93):

Equation 93

$$\alpha^{pq(b-1)(-k)} \eta(\alpha^{-pqk}) = \alpha^{pq(b-1)(-k)} \{\eta_{t-1} \alpha^{-pqk(t-1)} + \quad (93)$$
$$\eta_{t-2} \alpha^{-pqk(t-2)} + \ldots + \eta_2 \alpha^{-pqk\times 2} +$$
$$\eta_1 \alpha^{-pqk} + \eta_0\}$$
$$= \eta_{t-1} \alpha^{-pq(t+b-2)k} +$$
$$\eta_{t-2} \alpha^{-pq(t+b-3)k} + \ldots +$$
$$\eta_2 \alpha^{-pq(b+1)k} + \eta_1 \alpha^{-pqbk} + \eta_0 \alpha^{-pq(b-1)k}$$

For the $RS_b$ code, as an example with m=8, q=88, p=241, b=120, and L=15(t=8), one has the following equation (94):

Equation 94

$$\{\alpha_{bv[j]}\} = \{\alpha_{bv[0]}, \alpha_{bv[1]}, \alpha_{bv[2]}, \ldots \alpha_{bv[t-2]}, \alpha_{bv[t-1]}\} \quad (94)$$
$$= \{\alpha^{241\times88\times(255-119)}, \alpha^{241\times88\times(254-119)}, \alpha^{241\times88\times(253-119)},$$
$$\ldots \alpha^{241\times88\times(249-119)}, \alpha^{241\times88\times(248-119)}\}$$

The value of the numerator of said equation (91) are successively obtained. In addition, the following equation (95), as the relationship between derivative function $\sigma'(x)$ of the polynomial of the aforementioned equation and polynomial $\sigma_{odd}(x)$ of the sum of the odd-number terms of the aforementioned position polynomial, can be used.

$$\sigma'(x) = x \sigma_{odd}(x) \quad \text{Equation 95}$$

Said equation (91) can be broken down to the following equation (96).

Equation 96

$$e_k = \frac{\alpha^{pq(b-1)(-k)} \eta(\alpha^{-pqk})}{\sigma'(\alpha^{-pqk})} \quad (96)$$
$$= \frac{\alpha^{pq(b-1)(-k)} \eta(\alpha^{-pqk})}{\alpha^{-pqk} \sigma_{odd}(\alpha^{-pqk})}$$
$$= \frac{\alpha^{-pqbk} \eta(\alpha^{-pqk})}{\sigma_{odd}(\alpha^{-pqk})}$$

Because the value of the denominator can be derived simply in the process of detection of the error-position by said equation (88), the efficiency is even higher. The value of the numerator of said equation (96) is represented by the following equation (97).

Equation 97

$$\alpha^{-pqbk}\eta(\alpha^{-pqk}) = \alpha^{-pqbk}\{\eta_{t-1}\alpha^{-pqk(t-1)} + \qquad (97)$$
$$\eta_{t-2}\alpha^{-pqk(t-2)} + \ldots + \eta_2\alpha^{-pqk\times 2} +$$
$$\eta_1\alpha^{-pqk} + \eta_0\}$$
$$= \eta_{t-1}\alpha^{-pq(t+b-1)k} + \eta_{t-2}\alpha^{-pq(t+b-2)k} + \ldots +$$
$$\eta_2\alpha^{-pq(b+2)k} + \eta_1\alpha^{-pq(b+1)k} + \eta_0\alpha^{-pqbk}$$

For the $RS_b$ code, as an example with m=8, q=88, p=241, b=120, and L=15(t=8), one has the following equation (98):

Equation 98

$$\{\alpha_{bv[j]}\} = \{\alpha_{bv[0]}, \alpha_{bv[1]}, \alpha_{bv[2]}, \ldots \alpha_{bv[t-2]}, \alpha_{bv[t-1]}\} \qquad (98)$$
$$= \{\alpha^{241\times88\times(255-120)}, \alpha^{241\times88\times(254-120)},$$
$$\alpha^{241\times88\times(253-120)}, \ldots \alpha^{241\times88\times(249-120)},$$
$$\alpha^{241\times88\times(248-120)}\}$$

The value of the numerator of said equation (96) are successively obtained.

As explained in the above, by means of RS coding/decoding device (101), by performing Galois field element transformation, it is possible to perform RS coding/decoding on a Galois field. As a result, it is possible to reduce the number of multipliers and the number of inverse element operation circuit, it is possible to reduce the scale of the device, and it is possible to cut the manufacturing cost.

This invention is not limited to the aforementioned embodiments.

For example, in the embodiments illustrated in FIGS. 3, 4, 7, and 8, switching of the Galois field multiplication coefficients corresponding to the various code generation polynomials is carried out alone. This is equivalent to switching of the multiplier with a fixed value (coefficient multiplier). This type of coefficient multiplier can simply be realized as follows. For example, m by m matrix [xβ] is defined by the following equation (99) with respect to any z.

$$(\beta^{z+1})_b = [x\beta](\beta^z)_b \qquad \text{Equation 99}$$

In said equation (99), [xβ] is derived from said field generation polynomial $Gp_b(x)$. More specifically, using $B_{z,I}$, z=m, I=0~m−1 of said equation (55), the following equation (100) is established.

Equation 100

$$[x\beta] = \begin{pmatrix} B_{m,m-1} & 1 & 0 & \ldots & 0 & 0 & 0 \\ B_{m,m-2} & 0 & 1 & \ldots & 0 & 0 & 0 \\ \vdots & \vdots & & & & & \vdots \\ B_{m,3} & 0 & 0 & \ldots & 1 & 0 & 0 \\ B_{m,2} & 0 & 0 & \ldots & 0 & 1 & 0 \\ B_{m,1} & 0 & 0 & \ldots & 0 & 0 & 1 \\ B_{m,0} & 0 & 0 & \ldots & 0 & 0 & 0 \end{pmatrix} \qquad (100)$$

Consequently, the operation for the multiplication of certain fixed Galois field $\beta^d$, that is, the matrix corresponding to the following equation (101), can be obtained as m by m matrix $[x\beta]^d$ from said equation (100) equation 102. Consequently, when m=8, it can be realized by at most 10 of gates to 100 gates.

$$\beta^{z+d} = \beta^d \times \beta^z \qquad \text{Equation 101}$$
$$(\beta^{z+d})_b = [x\beta]^d(\beta^z)_b \qquad \text{Equation 102}$$

On the other hand, when the input of the Galois field multiplier is not fixed, in the aforementioned case with m=8, 300–400 gates are needed. Consequently, when there are 2–3 RS codes with different corresponding Galois fields (that is, with different field generation polynomials), the efficiency is higher by switching the coefficient multipliers having fixed multiplication coefficients themselves as compared with the case of the switching of Galois field multiplication coefficients.

Figure 9:
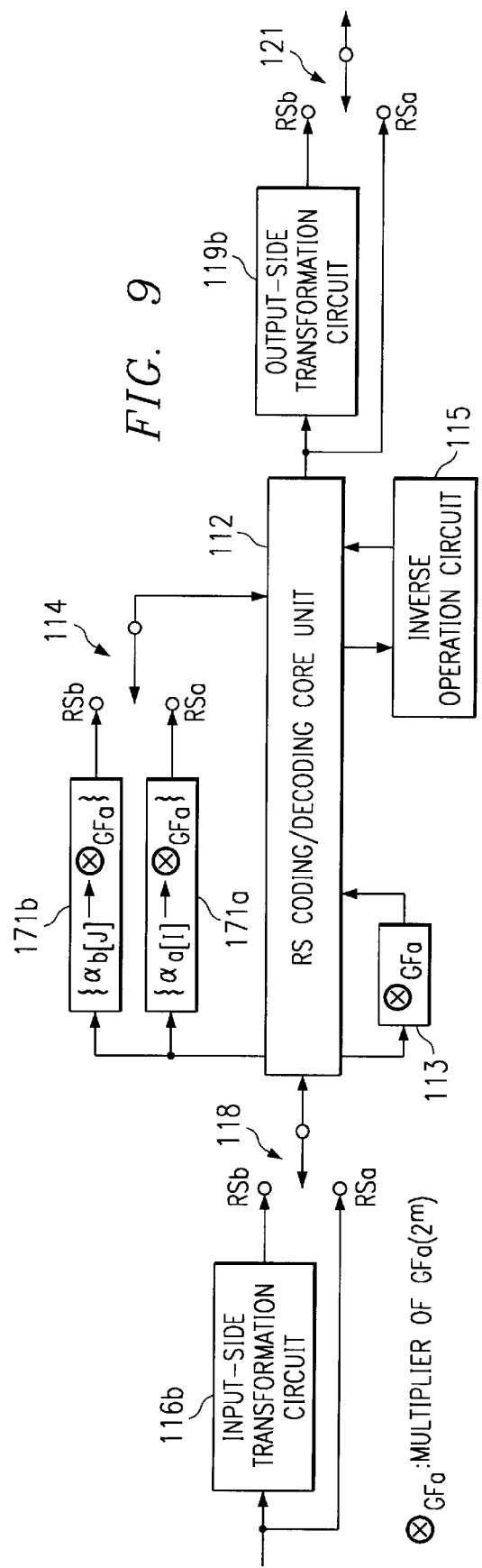
FIG. 9 is a diagram illustrating the constitution of another example of the RS coding/decoding device in an embodiment of this invention.

FIG. 9 is a diagram illustrating the embodiment of the constitution in which switching of the set of Galois field multiplication coefficients shown in FIG. 1 is realized by switching of the set of coefficient multipliers (the number of the RS codes that can be handled is 2). As shown in FIG. 9, the RS coding/decoding device has RS coding/decoding core unit 112, multiplier 113, switches 114, 118, 121, inverse element operation circuit 115, input-side transformation circuit 116b coefficient multipliers 171a, 171b, and output-side transformation circuit 119b.

When the fixed Galois field multiplier itself is switched, the circuit constitution shown in FIGS. 3, 4, 7, and 8 does not have much advantage over the conventional constitution with respect to the circuit scale. However, for the circuit constitution shown in FIGS. 5 and 6, because the input of the Galois field multiplier is not fixed, the scheme of this embodiment is preferred with respect to the circuit scale as compared with the conventional constitution with the number of the Galois field multipliers equal to the number of the RS codes (FIGS. 14 and 15).

In the aforementioned embodiment, for the RS coding/decoding device of the RS code ($RS_a$ code) defined over the originally present first Galois field ($GF_a(2^m)$), the topic is how to construct, at a high efficiency, the RS coding/decoding device of the RS code ($RS_b$ code) defined over the second Galois field $GF_b(2^m)$. Because the purpose is to form an RS coding/decoding device that can handle two RS codes, it is also possible to make use of a common Galois field multiplier as the third Galois field $GF_c(2^m)$ different from said Galois field $GF_a(2^m)$ and $GF_b(2^m)$. FIG. 10 is a diagram illustrating an example of this constitution.

As shown in FIG. 10, in this RS coding/decoding device, there are the following parts: RS coding/decoding core unit 112, input-side transformation circuits 116a, 116b, multiplier 113, inverse element operation circuit 115, multipliers 118b, 118c, output-side transformation circuits 119a, 119b, and switches 118, 121, 182 [sic].

In addition, in the aforementioned embodiment, an explanation was made with regard to the correction power for an $RS_a$ code identical to that of $RS_b$ code. It is clear that when there is a circuit matched with the side having a higher correction power, the other side may make use of said side in this constitution. That is, a condition for deriving the $RS_a$ code and $RS_b$ code in this scheme is that their field generation polynomials have the same order.

In the aforementioned embodiment of RS coding, the Euclidean decoding method was used in the explanation. However, this invention is not limited to this scheme. In this respect, because the fact that the series after the Galois field transformation is equivalent to the RS code (Goppa code) corresponding to the code generation polynomial of said equation (27) is generally proven, the well-known RS decoding method (Goppa decoding method or BCH decoding method in a higher class) may be applied.

As explained in the above, for the Reed-Solomon coding device and method of this invention, by performing the element transformation of the Galois field, it is possible to perform RS coding on a single Galois field. As a result, it is possible to reduce the number of multipliers and the number of inverse element operation circuit [parts], it is possible to reduce the scale of the device, and it is possible to cut the manufacturing cost.

Also, in the Reed-Solomon coding device and method of this invention, by performing the element transformation of the Galois field, it is possible to perform decoding of the RS coding data on a single Galois field. As a result, it is possible to reduce the number of multipliers and the number of inverse element operation circuit [parts], it is possible to reduce the scale of the device, and it is possible to cut the manufacturing cost.

What is claimed is:

1. A type of Reed-Solomon coding device that can handle multiple RS (Reed-Solomon) codes using different field generation polynomials, comprising:

means for storing multiple multiplication coefficient sets corresponding to multiple code-forming polynomials;

switching means for selecting one of said coefficient sets;

a Galois field transformation means that transforms the input data to the data of a prescribed Galois field;

a coding means that performs coding processing using a selected multiplication coefficient set for the aforementioned transformed data by means of the aforementioned Galois field after transformation; and a Galois field inverse transformation means that undertakes inverse transformation of the coded data of the aforementioned Galois field to a Galois field before transformation.

2. The Reed-Solomon coding device described in claim 1, wherein the aforementioned coding means has a multiplier corresponding to the aforementioned Galois field after transformation.

3. The Reed-Solomon coding device described in claim 1, wherein the aforementioned multiple RS codes are $RS_a$ codes and $RS_b$ codes using different field generation polynomials;

the coding symbols are Galois fields $GF_a(2^m)$ and $GF_b(2m)$ extended based on m-th order field generation polynomials $GP_a(x)$ and $GP_b(x)$ that are different from each other on Galois field GF(2), respectively;

for $\alpha$ as the root of said $Gp_a(x)$ and as the primitive element of said $GF_a(2^m)$ and for $\beta$ as the root of said $Gp_b(x)$ and as the primitive element of said $GF_b(2^m)$, the following equation (1) is established;

said $RS_b$ code has power of t-symbol error correction, and its code forming polynomial $G_{cb}(x)$ is represented by the following equation (2);

when the aforementioned input data are coded by said $RS_b$ code, said Galois field transformation means transforms the Galois field of the aforementioned input data from said Galois field $GF_b(2^m)$ into said Galois field $GF_a(2^m)$;

the aforementioned coding means performs coding corresponding to the following equation (3) as a polynomial, which transforms said code generation polynomial $Gc_b(x)$ to said Galois field $GF_a(2^m)$; and the aforementioned Galois field inverse transformation means undertakes inverse transformation of the aforementioned Galois field of coded data from said Galois field $GF_a(2m)$ into said Galois field $GF_b(2^m)$;

$$Gp_b(\alpha^p)=0 \qquad \text{Equation 1}$$

Equation 2

$$Gc_b(x) = \prod_{j=0}^{L}(x+\beta^{q(b+j)}), L = 2t-1, \text{ or } 2t$$

Equation 3

$$Gc_{ba}(x) = \prod_{j=0}^{L}(x+\alpha^{pq(b+j)}), L = 2t-1, \text{ or } 2t.$$

4. The Reed-Solomon coding device described in claim 1, wherein with the transposed matrix represented as $(\ldots)^T$, when m values among the 2m input/output relationships are as follows:

with respect to m-bit input $(00 \ldots 0001)^T$, m-bit output $A_0=(00 \ldots 00_1)^T$ is performed;

with respect to m-bit input $(00 \ldots 0010)^T$, m-bit output $A_1=(A_{1,m-1}, A_{1,m-2}, \ldots A_{1,0})^T$ is performed;

with respect to m-bit input, $(00 \ldots 0100)^T$ m-bit output $A_2=(A_{2,m-1}, A_{2,m-2}, \ldots A_{2,0})^T$ is performed;

with respect to m-bit input $(01 \ldots 0000)^T$, m-bit output $A_{m-2}=(A_{m-2,m-1}, A_{m-2,m-2}, \ldots A_{m-2,0})^T$ is performed;

with respect to m-bit input $(10 \ldots 0000)^T$, m-bit output $A_{m-1}=(A_{m-1,m-1}, A_{m-1,m-2}, \ldots A_{m-1,0})^T$ is performed;

with m by m matrix $[H_{ba}]$ being defined by the following equation (4); and the aforementioned Galois field transformation means performs operation processing corresponding to the following equation (5) with respect to said m-bit input data $D_{b-in}$ to generate m-bit output data $D_{a-out}$;

$$[H_{ba}]=(A_{m-1}A_{m-2}\ldots A_2A_1A_0) \qquad \text{Equation 4}$$

$$D_{a-out}=[H_{ba}]\times D_{b-in} \qquad \text{Equation 5.}$$

5. The Reed-Solomon coding device described in claim 4, wherein the aforementioned Galois field inverse transformation means performs operation processing corresponding to the following equation (6) to generate m-bit output data $D_{b-out}$ when the inverse matrix of said matrix $[H_{ba}]$ is $[H_{ab}]$;

$$D_{b-out}=[H_{ab}]\times D_{a-in} \qquad \text{Equation 6.}$$

6. A type of Reed-Solomon decoding device, that can handle multiple RS codes using different field generation polynomials, comprising:

means for storing multiple multiplication coefficient sets corresponding to multiple code-forming polynomials;

switching means for selecting one of said coefficient sets;

a Galois field transformation means that transforms the input coded data into the coded dat of the prescribed Galois field;

a decoding means that performs decoding processing using a selected multiplication coefficient set of the aforementioned transformed coded data by means of the aforementioned Galois field after transformation;

and a Galois field inverse transformation means that undertakes inverse transformation of the decoded data of the aforementioned Galois field to a Galois field before transformation.

7. The Reed-Solomon decoding device described in claim 6, wherein the aforementioned Galois field transformation means has a multiplier corresponding to the aforementioned Galois field after transformation.

8. The Reed-Solomon decoding device described in claim 6, wherein the aforementioned multiple RS codes are $RS_a$ codes and $RS_b$ codes using different field generation polynomials;

the coding symbols are Galois fields $GF_a(2^m)$ and $GF_b(2^m)$ extended based on m-th order field generation polynomials $Gp_a(x)$ and $Gp_b(x)$, which are different from each other, on Galois field GF(2), respectively;

for α as the root of said $GP_a(x)$ and as the primitive element of said $GF_a(2^m)$ and for β as the root of said $Gp_b(x)$ and as the primitive element of said $GF_b(2^m)$, the following equation (7) is established;

said $RS_b$ code has power of t-symbol error correction, and its code generation polynomial $G_{cb}(x)$ is represented by the following equation (8);

when the aforementioned input coded data are decoded;

said Galois field transformation means transforms the Galois field of the aforementioned coded data from said Galois field $GF_b(2^m)$ into said Galois field $GF_a(2^m)$;

the aforementioned decoding means performs decoding corresponding to the following equation (9) as a polynomial that transforms said code generation polynomial $G_{cb}(x)$ into said Galois field $GF_a(2^m)$;

and the aforementioned Galois field inverse transformation means undertakes transformation of the aforementioned Galois field of decoded data from said Galois field $GF_a(2^m)$ into said Galois field $GF_b(2^m)$;

$$Gp_b(\alpha^p) = 0 \qquad \text{Equation 7}$$

Equation 8

$$Gc_b(x) = \prod_{j=0}^{L} (x + \beta^{q(b+j)}), \; L = 2t-1, \; \text{or } 2t$$

Equation 9

$$Gc_{ba}(x) = \prod_{j=0}^{L} (x + \alpha^{pq(b+j)}), \; L = 2t-1, \; \text{or } 2t.$$

9. The Reed-Solomon decoding device described in claim 6 wherein with the transposed matrix represented as $(\ldots)^T$, when m values among the $2^m$ input/output relationships are as follows:

with respect to m-bit input $(00 \ldots 0001)^T$, m-bit output $A_0 = (00 \ldots 00_1)^T$ is performed;

with respect to m-bit input $(00 \ldots 0001)^T$, m-bit output $A_1 = (A_{1,m-1}, A_{1,m-2}, \ldots A_{1,0})^T$ is performed;

with respect to m-bit input $(00 \ldots 0100)^T$, m-bit output $A_2 = (A_{2,m-1}, A_{2,m-2}, \ldots A_{2,0})^T$ is performed;

with respect to m-bit input $(01 \ldots 0000)^T$, m-bit output $A_{m-2} = (A_{m-2,m-1}, A_{m-2,m-2}, \ldots A_{m-2,0})^T$ is performed;

with respect to m-bit input $(10 \ldots 0000)^T$, m-bit output $A_{m-1} = (A_{m-1,m-1}, A_{m-1,m-2}, \ldots A_{m-1,0})^T$ is performed;

with m by m matrix $[H_{ba}]$ being defined by following equation (10);

with the aforementioned Galois field transformation means performing operation processing corresponding to the following equation (11) with respect to said m-bit input data $D_{b-in}$ to generate m-bit output data $D_{a-out}$;

$$[H_{ba}] = (A_{m-1} A_{m-2} \ldots A_2 A_1 A_0) \qquad \text{Equation 10}$$

$$D_{a-out} = [H_{ba}] \times D_{b-in} \qquad \text{Equation 11.}$$

10. The Reed-Solomon coding device described in claim 9, wherein the aforementioned Galois field inverse transformation means performs operation processing corresponding to the following equation (12) to generate m-bit output data $D_{b-out}$ when the inverse matrix of said matrix $[H_{ba}]$ is $[H_{ab}]$;

$$D_{b-out} = [H_{ab}] \times D_{a-in} \qquad \text{Equation 12.}$$

11. A Reed-Solomon coding method, comprising in a Reed-Solomon decoding method that can handle multiple RS codes using different field generation polynomials, the steps of:

input data is transformed into data of a prescribed Galois field;

for the aforementioned transformed data, coding processing is carried out by means of the aforementioned Galois field after transformation;

coded data of the aforementioned Galois field is inverse transformed into data of a Galois field before the aforementioned transformation; and wherein the aforementioned multiple RS codes are $RS_a$ codes and $RS_b$ codes using different field generation polynomials;

the coding symbols are Galois fields $GF_a(2^m)$ and $GF_b(2^m)$ extended based on m-th order field generation polynomials $Gp_a(x)$ and $Gp_b(x)$ which are different from each other, on Galois field GF(2), respectively;

for α as the root of said Gpa(x) and as the primitive element of said $GF_a(2^m)$ and for β as the root of said $Gp_b(x)$ and as the primitive element of said $GF_b(2^m)$, the following equation (13) is established;

said $RS_b$ code has power of t-symbol error correction, and its code generation polynomial $Gc_b(x)$ is represented by the following equation (14);

when the aforementioned input data are coded by said $RS_b$ code, the Galois field of the aforementioned input data is transformed from said Galois field $GF_b(2^m)$ into said Galois field $GF_a(2m)$;

the aforementioned coding is performed corresponding to the following equation (15) as a polynomial that transforms said code generation polynomial $G_{cb}(x)$ into said Galois field $GF_a(2^m)$; and the aforementioned Galois field of the coded data is inverse transformed from said Galois field $GF_a(2^m)$ into said Galois field $GF_b(2^m)$, $$Gp_b(\alpha^p) = 0 \qquad \text{Equation 13}$$

Equation 14

$$Gc_b(x) = \prod_{j=0}^{L} (x + \beta^{q(b+j)}), \; L = 2t-1, \; \text{or } 2t \qquad (14)$$

Equation 15

$$Gc_{ba}(x) = \prod_{j=0}^{L} (x + \alpha^{pq(b+j)}), \quad L = 2t-1, \text{ or } 2t. \tag{15}$$

12. A Reed-Solomon coding method, comprising in the Reed-Solomon decoding method that can handle multiple RS codes using different field generation polynomials, the steps of:

the input data are transformed into the data of a prescribed Galois field, for the aforementioned transformed data, coding processing is carried out by means of the aforementioned Galois field after transformation;

the Galois field of the aforementioned coded data is inverse transformed into the Galois field before the aforementioned transformation; and wherein with the transposed matrix represented as $(\ldots)^T$, when m values among the $2^m$ transformation relationships are as follows:

with respect to m-bit input $(00 \ldots 0001)^T$, m-bit output $A_0 = (00 \ldots 00_1)^T$ is performed;

with respect to m-bit input $(00 \ldots 0010)^T$, m-bit output $A_1 = (A_{1,m-1}, A_{1,m-2}, \ldots A_{1,0})^T$ is performed;

with respect 59 m-bit input $(00 \ldots 0100)^T$, m-bit output $A_2(A_{2,m-1}, A_{2,m-2}, \ldots A_{2,0})^T$ is performed;

with respect to m-bit input $(00 \ldots 0100)^T$, m-bit output $A_{m-2} = (A_{m-2,m-1}, A_{m-2,m-2}, \ldots A_{m-2,0})^T$ is performed;

with respect to m-bit input $(10 \ldots 0000)^T$, m-bit output $A_{m-1} = (A_{m-1,m-1}, A_{m-1,m-2}, \ldots A_{m-1,0})^T$ is performed;

and m by m matrix $[H_{ba}]$ is defined by the following equation (16), the aforementioned Galois field transformation of the input data is performed by carrying out operation processing corresponding to the following equation (17) with respect to said m-bit input data $D_{b\text{-}in}$ to generate m-bit output data $D_{a\text{-}out}$;

$$[H_{ba}] = (A_{m-1} A_{m-2} \ldots A_2 A_1 A_0) \qquad \text{Equation 16}$$

$$D_{a\text{-}out} = [H_{ba}] \times D_{b\text{-}in} \qquad \text{Equation 17.}$$

13. The Reed-Solomon coding method described in claim 12, wherein the aforementioned Galois field inverse transformation is performed by:

carrying out operation processing corresponding to the following equation (18) to generate m-bit output data $D_{b\text{-}out}$ when the inverse matrix of said matrix $[H_{ba}]$ is $[H_{ab}]$;

$$D_{b\text{-}out} = [H_{ab}] \times D_{a\text{-}in} \qquad \text{Equation 18.}$$

* * * * *